s010818684B2

(12) United States Patent
Cheon et al.

(10) Patent No.: US 10,818,684 B2
(45) Date of Patent: Oct. 27, 2020

(54) VERTICAL MEMORY DEVICES AND METHODS OF MANUFACTURING THE SAME

(71) Applicant: Samsung Electronics Co., Ltd., Suwon-si, Gyeonggi-do (KR)

(72) Inventors: Ji-Sung Cheon, Ansan-si (KR); Seok-cheon Baek, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 16/215,842

(22) Filed: Dec. 11, 2018

(65) Prior Publication Data

US 2019/0312049 A1 Oct. 10, 2019

(30) Foreign Application Priority Data

Apr. 9, 2018 (KR) ........................ 10-2018-0040936

(51) Int. Cl.
*H01L 27/11573* (2017.01)
*H01L 27/11582* (2017.01)
(Continued)

(52) U.S. Cl.
CPC .. *H01L 27/11573* (2013.01); *H01L 21/02274* (2013.01); *H01L 27/11529* (2013.01); *H01L 27/11582* (2013.01); *H01L 29/42364* (2013.01)

(58) Field of Classification Search
CPC ......... H01L 27/11573; H01L 27/11575; H01L 27/11529; H01L 27/11548;
(Continued)

(56) References Cited

U.S. PATENT DOCUMENTS 6,867,141 B2    3/2005  Jung et al.
8,013,389 B2    9/2011  Oh et al.
(Continued)

FOREIGN PATENT DOCUMENTS

JP      2011-0003734 A    1/2011
KR   10-1999-0027890 A    4/1999

OTHER PUBLICATIONS

Singapore Search Report and Written Opinion dated Sep. 2, 2019 issued in corresponding Singapore Application No. 10201900547Y.
(Continued)

*Primary Examiner* — Hsien Ming Lee
(74) *Attorney, Agent, or Firm* — Harness, Dickey & Pierce, P.L.C.

(57) ABSTRACT

A vertical memory device includes a gate structure including a first gate electrode on a peripheral circuit region of a substrate, the substrate containing a cell region and the peripheral circuit region, a plurality of second gate electrodes sequentially stacked on the cell region of the substrate, the plurality of second gate electrodes spaced apart from each other in a vertical direction to an upper surface of the substrate, a channel extending in the vertical direction on the cell region of the substrate and extending through at least one of the second gate electrodes, and a first insulating interlayer covering the gate structure on the peripheral circuit region of the substrate, a cross-section in one direction of an upper surface of a portion of the first insulating interlayer overlapping the gate structure in the vertical direction having a shape of a portion of a polygon.

20 Claims, 17 Drawing Sheets

(51) Int. Cl.
*H01L 29/423* (2006.01)
*H01L 27/11529* (2017.01)
*H01L 21/02* (2006.01)

(58) Field of Classification Search
CPC ......... H01L 27/11582; H01L 27/11595; H01L 27/11556; H01L 21/76816
See application file for complete search history.

(56) References Cited

U.S. PATENT DOCUMENTS

| | | |
|---|---|---|
| 8,735,967 B2 | 5/2014 | Lim et al. |
| 8,971,118 B2 | 3/2015 | Jin et al. |
| 8,975,731 B2 | 3/2015 | Min |
| 9,780,113 B2 | 10/2017 | Im et al. |
| 2015/0340374 A1 | 11/2015 | Jung et al. |
| 2016/0268267 A1 | 9/2016 | Iinuma et al. |
| 2016/0343725 A1 | 11/2016 | Jung et al. |
| 2017/0025423 A1 | 1/2017 | Terada et al. |
| 2018/0090512 A1 | 3/2018 | Kim et al. |
| 2019/0304991 A1* | 10/2019 | Seo ................... H01L 27/11573 |

OTHER PUBLICATIONS

Min-Chun Tsai, "A Formula of STI CMP Design Rule" *GLSVLSI*'08 May 4. 2008, pp. 11-16.
Extended European Search Report dated Jul. 9, 2019, issued in corresponding European , Patent Application No. 18212978.3.

* cited by examiner

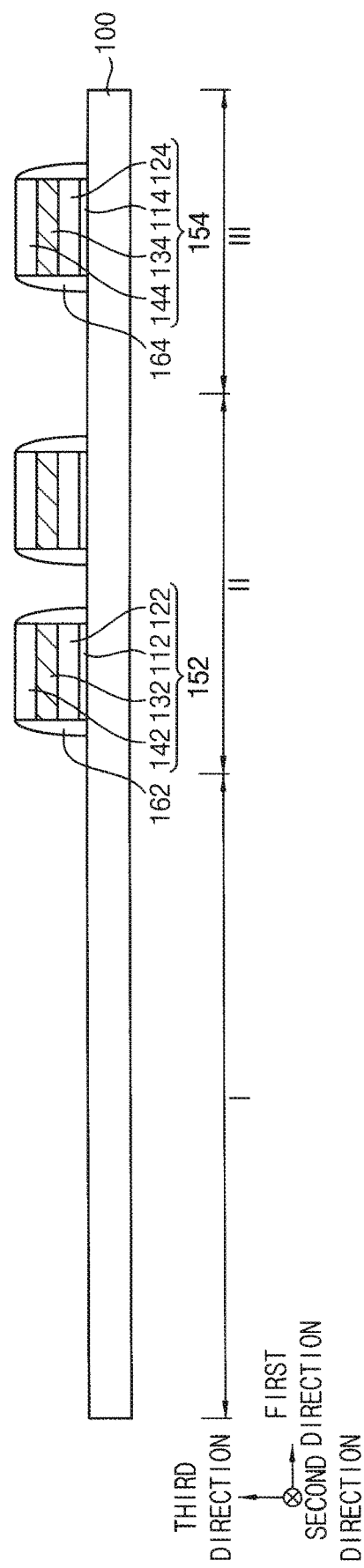

VERTICAL MEMORY DEVICES AND METHODS OF MANUFACTURING THE SAME

CROSS-REFERENCE TO RELATED APPLICATION

This application claims priority under 35 USC § 119 to Korean Patent Application No. 10-2018-0040936, filed on Apr. 9, 2018 in the Korean Intellectual Property Office (KIPO), the contents of which are herein incorporated by reference in their entirety.

BACKGROUND

1. Field

Example embodiments relate to vertical memory devices and methods of manufacturing the same.

2. Description of the Related Art

In manufacturing a VNAND flash memory device on a substrate including a cell region and a peripheral circuit region, a gate structure may be formed on the peripheral circuit region and an insulating interlayer covering the gate structure may be formed on the cell region and the peripheral circuit region. The insulating interlayer may have a non-flat upper surface due to the gate structure, and thus a planarization process may be performed on the insulating interlayer. However, the upper surface of the insulating interlayer may be scratched on the cell region of the substrate during the planarization process, and the characteristics of the VNAND flash memory device may be deteriorated.

SUMMARY

Example embodiments provide a vertical memory device having improved electrical characteristics.

Example embodiments provide a method of manufacturing a vertical memory device having improved electrical characteristics.

According to example embodiments, there is provided a vertical memory device. The vertical memory device may include a gate structure including a first gate electrode on a peripheral circuit region of a substrate, the substrate containing a cell region and the peripheral circuit region, a plurality of second gate electrodes sequentially stacked on the cell region of the substrate, the plurality of second gate electrodes spaced apart from each other in a vertical direction to an upper surface of the substrate, a channel extending in the vertical direction on the cell region of the substrate and extending through at least one of the second gate electrodes, and a first insulating interlayer covering the gate structure on the peripheral circuit region of the substrate, a cross-section in one direction of an upper surface of a portion of the first insulating interlayer overlapping the gate structure in the vertical direction having a shape of a portion of a polygon.

According to example embodiments, there is provided a vertical memory device. The vertical memory device may include a gate structure including a first gate electrode on a peripheral circuit region of a substrate, the substrate containing a cell region and the peripheral circuit region, a second gate electrode on the cell region of the substrate, a first insulating interlayer on the cell region and the peripheral circuit region of the substrate, the first insulating interlayer covering the gate structure and the second gate electrode, a second insulating interlayer on the first insulating interlayer, third and fourth gate electrodes sequentially stacked on a portion of the second insulating interlayer on the cell region of the substrate, the third and fourth gate electrodes spaced apart from each other in a vertical direction to an upper surface of the substrate, and a channel extending through the third and fourth gate electrodes in the vertical direction. In example embodiments, an upper surface of at least a portion of the first insulating interlayer on the peripheral circuit region of the substrate may have an angulated protrusion and depression shape.

According to example embodiments, there is provided a vertical memory device. The vertical memory device may include a gate structure including a first gate electrode on a peripheral circuit region of a substrate, the substrate containing a cell region and the peripheral circuit region, a plurality of second gate electrodes sequentially stacked on the cell region of the substrate, the plurality of second gate electrodes spaced apart from each other in a vertical direction to an upper surface of the substrate, a channel extending through at least one of the second gate electrodes in the vertical direction on the cell region of the substrate, and first to third insulating interlayers sequentially stacked on the peripheral circuit region of the substrate. In example embodiments, the first insulating interlayer may cover the gate structure, and an upper surface of at least a portion of the first insulating interlayer may have an angular protrusion and depression shape, an upper surface of a portion of the second insulating interlayer may have a rounded protrusion and depression shape corresponding to that of the upper surface of the at least a portion of the first insulating interlayer, and the third insulating interlayer may have a flat upper surface.

According to example embodiments, there is provided a method of manufacturing a vertical memory device. The method may include forming a gate structure including a first gate electrode on a peripheral circuit region of a substrate, the substrate containing a cell region and the peripheral circuit region, forming a first sacrificial pattern on the cell region of the substrate, forming a first insulating interlayer on the substrate to cover the gate structure and the first sacrificial pattern, forming a second insulating interlayer on the first insulating interlayer, performing a wet etching process on an upper surface of the second insulating interlayer, alternately and repeatedly stacking a second sacrificial pattern and an insulation pattern on the second insulating interlayer of the cell region of the substrate in a vertical direction to an upper surface of the substrate, forming a channel through the second sacrificial patterns and the insulation patterns to extend in the vertical direction on the cell region of the substrate, and replacing each of the first and second sacrificial patterns with a second gate electrode.

According to example embodiments, there is provided a method of manufacturing a vertical memory device. The method may include forming a gate structure including a first gate electrode on a peripheral circuit region of a substrate, the substrate containing a cell region and the peripheral circuit region, forming a first sacrificial pattern on the cell region of the substrate, forming a first insulating interlayer on the substrate to cover the gate structure and the first sacrificial pattern, an upper surface of a portion of the first insulating interlayer on the gate structure having an angular protrusion and depression shape, forming a second insulating interlayer on the first insulating interlayer, an upper surface of the second insulating interlayer having a rounded shape corresponding to the protrusion and depression shape of the upper surface of the portion of the first insulating interlayer, forming a mold on the second insulating interlayer of the cell region of the substrate, the mold including second sacrificial patterns and insulation patterns alternately and repeatedly stacked in a vertical direction to an upper surface of the substrate, forming a third insulating interlayer on the second insulating interlayer to cover a sidewall of the mold, the third insulating interlayer having a flat upper surface, and replacing each of the first and second sacrificial patterns with a second gate electrode.

In the method of manufacturing the vertical memory device, the planarization process may not be performed immediately after forming the insulating interlayer on the GSL, and thus the deterioration of characteristics of the vertical memory device may be reduced or prevented.

A wet etching process may be performed on the concave portion of the insulating interlayer generated by the opening for dividing the GSL, so that the angular protrusion and depression shape may be transformed into a rounded protrusion and depression shape, which may alleviate the deterioration of characteristics of the vertical memory device due to the concentration of the electric field.

BRIEF DESCRIPTION OF THE DRAWINGS

FIGS. 2 to 12 are cross-sectional views illustrating a method of manufacturing a vertical memory device in accordance with example embodiments;

DESCRIPTION OF EMBODIMENTS

Vertical memory devices and methods of manufacturing the same in accordance with example embodiments will be described more fully hereinafter with reference to the accompanying drawings. Hereinafter, two directions intersecting with each other among horizontal directions substantially parallel to an upper surface of a substrate are defined as first and second directions, respectively, and a vertical direction substantially perpendicular to the upper surface of the substrate is defined as a third direction. In example embodiments, the first and second directions may be orthogonal to each other.

Figure 1A:
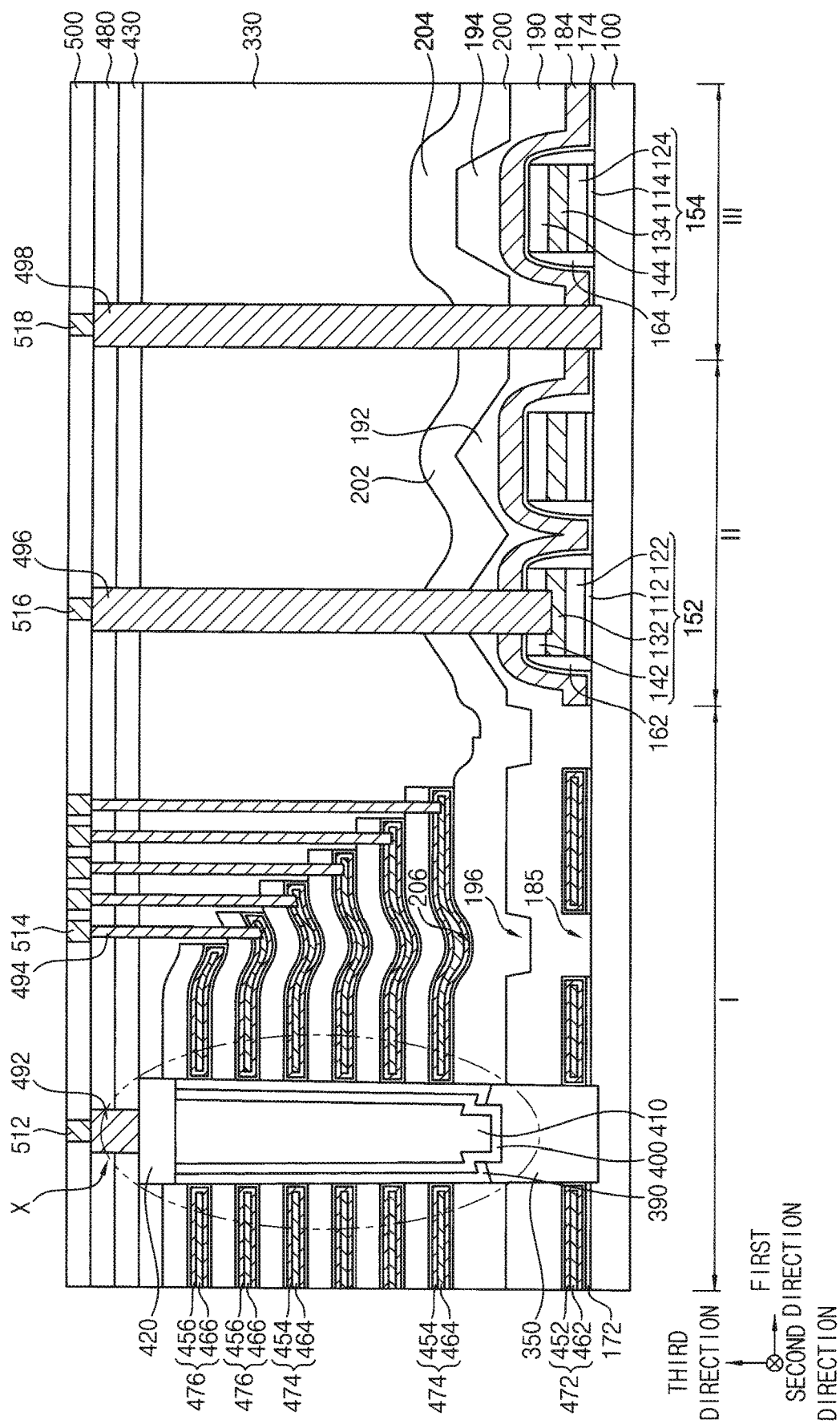
FIG. 1A is a cross-sectional view illustrating a vertical memory device in accordance with example embodiments.
Figure 1B:
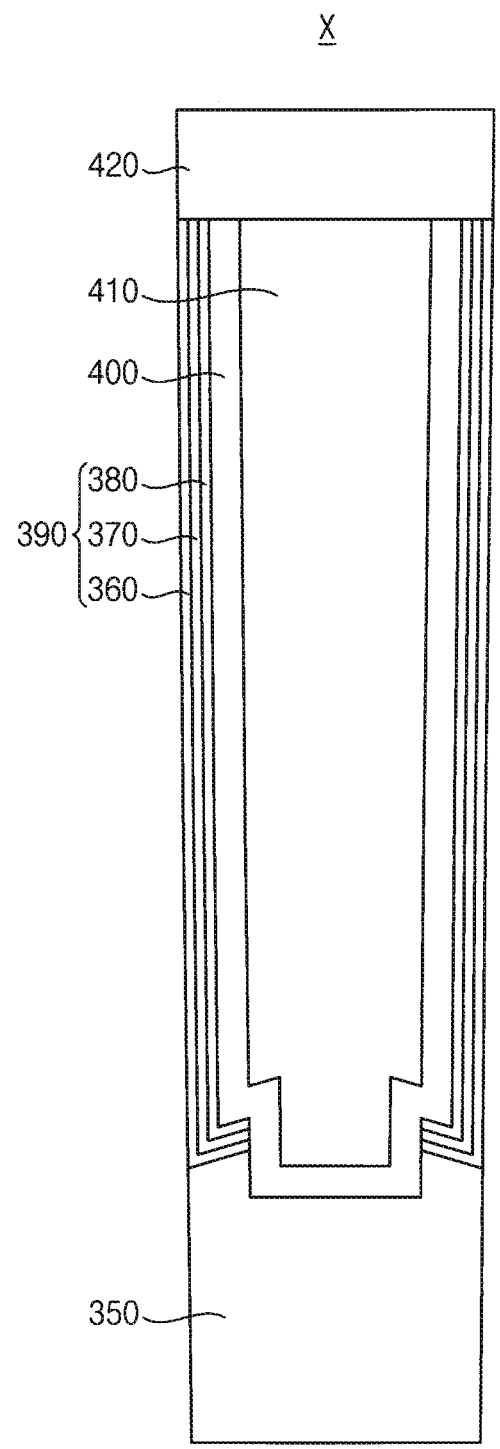
FIG. 1B is an enlarged cross-sectional view of a region X in FIG. 1A.

FIG. 1A is a cross-sectional view illustrating a vertical memory device in accordance with example embodiments, and FIG. 1B is an enlarged cross-sectional view of a region X in FIG. 1A.

Referring to FIG. 1A and FIG. 1B, the vertical memory device may include cell gate electrodes on a first region I of a substrate 100 including first to third regions I, II, and III, a second structure extending through the cell gate electrodes, first and second gate structures 152 and 154 on the second and third regions II and III, respectively, of the substrate 100, first to third insulation patterns 172, 174, and 325, an etch stop pattern 184, and/or first to sixth insulating interlayers 190, 200, 330, 430, 480, and 500.

The vertical memory device may further include first and second gate spacers 162 and 164, a second blocking layer 440, a common source line (CSL)(not shown), first to fourth contact plugs 492, 494, 496, and 498, and/or first to fourth wirings 512, 514, 516, and 518.

The substrate 100 may include semiconductor materials e.g., silicon, germanium, silicon-germanium, etc., or III-V compounds e.g., GaP, GaAs, GaSb, etc. In some example embodiments, the substrate 100 may be a silicon-on-insulator (SOI) substrate or a germanium-on-insulator (GOI) substrate.

In example embodiments, the first region I of the substrate 100 may be a cell region where memory cells are formed, and the second and third regions II and III of the substrate 100 may be a peripheral circuit region where X-decoders, page buffers, Y-decoders, driving circuits, etc. may be formed. Hereinafter, however, in the peripheral region, a region where the gate structures are formed relatively densely is referred to as the second region II, and a region where the gate structures are formed relatively sparsely is referred to as the third region III.

The first gate structure 152 on the second region II of the substrate 100 may include a first gate insulation pattern 112, a first polysilicon pattern 122, a first metal pattern 132, and/or a first gate mask 142 sequentially stacked, and the second gate structure 154 on the third region III of the substrate 100 may include a second gate insulation pattern 114, a second polysilicon pattern 124, a second metal pattern 134, and/or a second gate mask 144 sequentially stacked. The first polysilicon pattern 122 together with the first metal pattern 132 may be referred to as a first gate electrode, and the second polysilicon pattern 124 together with the second metal pattern 134 may be referred to as a second gate electrode. The first and second gate spacers 162 and 164 may be formed on sidewalls of the first and second gate structures 152 and 154, respectively.

The first and second gate insulation patterns 112 and 114 may include an oxide, e.g., silicon oxide, the first and second polysilicon patterns 122 and 124 may include polysilicon doped with p-type impurities or n-type impurities, the first and second metal patterns 132 and 134 may include a metal, e.g., tungsten, tantalum, titanium, etc., and the first and second gate masks may include an oxide, e.g., silicon oxide. The first and second gate spacers 162 and 164 may include an oxide, e.g., silicon oxide, and thus may be merged with the first and second gate masks 142 and 144, respectively.

In example embodiments, the first insulation pattern 172 may have a rectangular shape on the first region I of the substrate 100 in a plan view, and the second insulation pattern 174 and the etch stop pattern 184 may cover the first and second gate structures 152 and 154 and the first and second gate spacers 162 and 164 on the second and third regions II and III of the substrate 100 in a plan view. However, a first opening 185 partially exposing an upper surface of the substrate 100 may be formed through a third gate electrode 472 of the cell gate electrodes and the first insulation pattern 172 thereunder. In example embodiments, a plurality of first openings 185 may be formed to be spaced apart from each other in the second direction.

The first and second insulation patterns 172 and 174 may include an oxide, e.g., silicon oxide, and thus the second insulation pattern 174 may be merged with the first and second gate masks 142 and 144 and/or the first and second gate spacers 162 and 164. The etch stop pattern 184 may include a nitride, e.g., silicon nitride.

The first insulating interlayer 190 may be formed on the first to third regions I, II, and III of the substrate 100 to cover the first and second insulation patterns 172 and 174, the third gate electrode 472, and the etch stop pattern 184, and the second insulating interlayer 200 may be formed on the first insulating interlayer 190.

Each of the first and second insulating interlayers 190 and 200 may include silicon oxide. In example embodiments, the first and second insulating interlayers 190 and 200 may include different materials from each other. For example, the first insulating interlayer 190 may have high-density plasma (HDP) oxide, and the second insulating interlayer 200 may have tetraethyl orthosilicate (TEOS).

An upper surface of the first insulating interlayer 190 may not be flat due to the first and second gate structures 152 and 154 on the second and third regions II and III, respectively, of the substrate 100. That is, portions of the first insulating interlayer 190 on the first and second gate structures 152 and 154 may upwardly protrude when compared to other portions thereof.

In example embodiments, an upper surface of at least a portion of the first insulating interlayer 190 on the second and third regions II and III of the substrate 100 may have a cross-section in one direction, e.g., in the first direction with a shape of an angular protrusion and depression.

For example, upper surfaces of portions of the first insulating interlayer 190 on the first and second gate structures 152 and 154, that is, upper surfaces of first and second portions 192 and 194 of the first insulating interlayer 190 overlapping the first and second gate structures 152 and 154, respectively, in the third direction may have cross-sections in the first direction having a shape of a portion of a polygon. In one embodiment, the upper surface of the first portion 192 of the first insulating interlayer 190 overlapping the first gate structures 152 in the first direction, which may be arranged relatively densely, may have a cross-section with a shape of a portion of a triangle (including two sides neighboring with each other at an obtuse or acute angle), and the upper surface of the second portion 194 of the first insulating interlayer 190 overlapping the second gate structures 154 in the first direction, which may be arranged relatively sparsely, may have a cross-section with a shape of a portion of a rectangle or a hexagon (including three sides neighboring with each other at an obtuse angle).

A first concave portion 196 may be formed on the upper surface of the first insulating interlayer 190 on the first region I of the substrate 100, which may correspond to the first opening 185 through the first insulation pattern 172 and the third gate electrode 472. That is, the first concave portion 196 of the upper surface of the first insulating interlayer 190 over the first opening 185 may have a relatively short distance from the upper surface of the substrate 100 when compared to other portions of the upper surfaces of the first insulating interlayer 190 on the first region I of the substrate 100.

In example embodiments, the first concave portion 196 on the upper surface of the first insulating interlayer 190 may have a cross-section in the first direction with a shape of a portion of a polygon (including three sides neighboring with each other at an obtuse angle).

An upper surface of the second insulating interlayer 200 may have a shape corresponding to the shape of the upper surface of the first insulating interlayer 190. Thus, portions of the second insulating interlayer 200, which are formed on the first and second gate structures on the second and third regions II and III of the substrate 100, may upwardly protrude when compared to other portions thereof. However, unlike the cross-section of the upper surface of the first insulating interlayer 190, the cross-section of the upper surface of the second insulating interlayer 200 may have a smoothly curved shape instead of an angular protrusion and depression shape. That is, upper surfaces of third and fourth portions 202 and 204 of the second insulating interlayer 200 overlapping the first and second gate structures 152 and 154, respectively, in the third direction may have a cross-section in the first direction with a rounded curve shape corresponding to a portion of a polygon.

A second concave portion 206 may be formed on the upper surface of the second insulating interlayer 200 on the first region I of the substrate 100, which may correspond to the first opening 185 through the first insulation pattern 172 and the third gate electrode 472. That is, the second concave portion 206 of the upper surface of the second insulating interlayer 200 may overlap the first concave portion 196 of the first insulating interlayer 190 in the third direction, but may have a cross-section in the first direction with a rounded concave shape corresponding to that of the first concave portion 196.

A mold of a staircase shape including a plurality of steps, each of which may include a fourth gate electrode 474 and the third insulation pattern 325 thereon or a fifth gate electrode 476 and the third insulation pattern 325 thereon, may be formed on the second insulating interlayer 200 on the first region I of the substrate 100, and the third insulating interlayer 330 may cover a sidewall and an upper surface of the mold.

In example embodiments, the steps included in the mold may have areas gradually decreasing at a constant rate from a lowermost one toward an uppermost one thereof. The lowest one of the steps in the mold may have a smaller area than one of the steps including the first insulation pattern 172 and the third gate electrode 472 in a plan view.

An upper surface of the third insulating interlayer 330 may be substantially flat without irregularities unlike the upper surface of the second insulating interlayer 200. The third insulating interlayer 330 may include a silicon oxide, e.g., TEOS, and thus may be merged with the underlying second insulating interlayer 200.

Each of the cell gate electrodes may extend in the first direction, and a plurality of cell gate electrodes may be formed in the second direction. That is, the cell gate electrodes each extending in the first direction may be spaced apart from each other by a second opening (not shown) extending in the first direction.

An end portion of each of the cell gate electrodes in the first direction may be referred to as a pad. The cell gate electrodes may be stacked at a plurality of levels, respectively, to be spaced apart from each other in the third direction, and the cell gate electrodes of each level may extend in the first direction on the first region I of the substrate 100. Lengths of the cell gate electrodes at the plurality of levels, respectively, may gradually decrease from a lowermost one toward an uppermost one thereof, and thus the cell gate electrodes may have a staircase shape as a whole.

The cell gate electrodes may include the third to fifth gate electrodes 472, 474, and 476 sequentially stacked in the third direction. The third gate electrode 472 may serve as a ground selection line (GSL), the fourth gate electrode 474 may serve as a word line, and the fifth gate electrode 476 may serve as a string selection line (SSL).

The third gate electrode 472 may be formed at a lowest level and may be covered with the first insulating interlayer 190, and the fourth and fifth gate electrodes 474 and 476 may be formed at one or a plurality of levels on the second insulating interlayer 200. In example embodiments, the fifth gate electrode 486 may be formed at an uppermost level and one level thereunder, and the fourth gate electrode 474 may be formed at plurality of levels between the third gate electrode 472 and fifth gate electrode 476.

In example embodiments, the third gate electrodes 472 may be separated with each other in the second direction by the first opening 185 described above. Portions of the fourth and fifth gate electrodes 474 and 476 overlapping the first opening 185 in the third direction may have an upwardly concave shape. Unlike the angular shape of the first concave portion 196 of the upper surface of the portion of the first insulating interlayer 190 overlapping the first opening 185 in the third direction, the second concave portion 206 of the upper surface of the second insulating interlayer 200 may have a rounded shape, so that the portions of the fourth and fifth gate electrodes 474 and 476 on the second insulating interlayer 200 may also have not a rapidly concave shape but a gently concave shape. Accordingly, a phenomenon in which an electric field is concentrated on the above portions of the fourth and fifth gate electrodes 474 and 476 may be alleviated.

The third gate electrode 472 may include a third gate conductive pattern 462 and a third gate barrier pattern 452 covering upper and lower surfaces and a portion of a sidewall thereof, the fourth gate electrode 474 may include a fourth gate conductive pattern 464 and a fourth gate barrier pattern 454 covering upper and lower surfaces and a portion of a sidewall thereof, and the fifth gate electrode 476 may include a fifth gate conductive pattern 466 and covering upper and lower surfaces and a portion of a sidewall thereof.

Each of the third to fifth gate conductive patterns 462, 464 and 466 may include a low resistance metal, e.g., tungsten, titanium, tantalum, platinum, etc., and each of the third to fifth gate barrier patterns may include a metal nitride, e.g., titanium nitride, tantalum nitride, etc. Alternatively, each of the third to fifth gate conductive patterns 462, 464 and 466 may include a first layer including a metal and a second layer including a metal nitride.

The second structure may extend through the cell gate electrodes. The second structure may include an epitaxial layer 350, a first structure, and a capping pattern 420 sequentially stacked on the first region I of the substrate 100.

The epitaxial layer 350 may fill a lower portion of a channel hole 340 (refer to FIG. 9) extending through the first insulation pattern 172, the third gate electrode 472, the first and second insulating interlayers 190 and 200, the fourth and fifth gate electrodes 474 and 476, the third insulation pattern 325 and the third insulating interlayer 330, and exposing the first region I of the substrate 100, and may contact the upper surface of the substrate 100. The channel hole 340 may be formed on the first region I of the substrate 100 in each of the first and second directions to form a plurality of channel hole arrays.

In example embodiments, the epitaxial layer 350 may include single crystalline silicon, and a height of an upper surface thereof may be higher than a lower surface of the first insulating interlayer 190 and lower than the upper surface of the second insulating interlayer 200.

The first structure may be formed on the epitaxial layer 350 in the channel hole 340, and may include a channel 400, a charge storage structure 390 covering an outer sidewall of the channel 400, and a filling pattern 410 filling a space formed by an inner wall of the channel 400 and contacting the upper surface of the epitaxial layer 350.

In example embodiments, the channel 400 may have a cup-like shape, the charge storage structure 390 may have a cup-like shape of which a central lower surface is opened, and the filling pattern 410 may have a pillar shape.

As the channel holes 340 in which the channels 400 are formed may form the channel hole arrays, the channels 400 may also form channel arrays corresponding thereto. The epitaxial layer 350 under the channel 400 may be referred to as a lower channel, and channel 400 may be referred to as an upper channel.

The channel 400 may include doped or undoped polysilicon or single crystalline silicon, and the filling pattern 410 may include an oxide, e.g., silicon oxide.

The charge storage structure 290 may include a tunnel insulation pattern 380, a charge storage pattern 370 and a first blocking pattern 360 sequentially stacked in the horizontal direction from the outer sidewall of the channel 400. Each of the tunnel insulation pattern 380 and the first blocking pattern 360 may include an oxide, e.g., silicon oxide, and the charge storage pattern 370 may include a nitride, e.g., silicon nitride.

The capping pattern 420 may be formed on the first structure in the channel hole 340. The capping pattern 420 may include doped or undoped polysilicon or single crystalline silicon.

In example embodiments, the epitaxial layer 350 may extend through the third gate electrode 472, and the channel 400 may extend through the fourth and fifth gate electrodes 474 and 476. Accordingly, the epitaxial layer 350 may extend through the third gate electrode 472, and may serve as a channel of a ground selection transistor (GST) including the third gate electrode 472. The channel 400 may extend through the fourth and fifth gate electrodes 474 and 476, and may serve as a channel of a string selection transistor (SST) including the fourth and fifth gate electrodes 474 and 476.

The third insulation pattern 325 may be formed between the fourth and fifth gate electrodes 474 and 476 arranged in the third direction, and on an uppermost one of the fifth gate electrodes 476. The third insulation pattern 325 may include a silicon oxide, e.g., TEOS, high density plasma (HDP) oxide, plasma enhanced oxide (PEOX), etc.

The fourth to sixth insulating interlayers 430, 480 and 500 may be formed on the third insulating interlayer 330, and may include an oxide, e.g., silicon oxide. Accordingly, the fourth to sixth insulating interlayers 430, 480 and 500 may be merged with each other, and/or may be merged with the underlying third insulating interlayer 330.

Each of the third to fifth gate electrodes 472, 474 and 476 may be surrounded by the second blocking layer 440. Thus, an outer sidewall of the charge storage structure 390 or a sidewall of the epitaxial layer 350 may contact the second blocking layer 440. The second blocking layer 440 may include a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

A common source line (CSL)(not shown) and a second spacer (not shown) covering a sidewall of the CSL may be formed in the second opening separating the plurality of cell gate electrodes, each of which may extend in the first direction, from each other in the second direction. The CSL may include a metal, a metal nitride, etc., and the second spacer may include an insulating material, e.g., silicon oxide, silicon nitride, etc.

The first contact plug 492 may extend through the fourth and fifth insulating interlayers 430 and 480 to contact an upper surface of the capping pattern 420, the second contact plug 494 may extend through the third to fifth insulating interlayers 330, 430 and 480, the third insulation pattern 325, the second blocking layer 440 and fourth and fifth gate barrier pattern 454 and 456 to contact each of upper surfaces of the fourth and fifth gate conductive patterns 464 and 466, or may extend through the first to fifth insulating interlayers 190, 200, 330, 430 and 480, the second blocking layer 440 and the third gate barrier pattern 452 to contact an upper surface of the third gate conductive pattern 462. The second contact plug 494 may be formed on each of the pads having a staircase shape. That is, the second contact plug 494 may be formed on a portion of each pad not covered by upper pads.

The third contact plug 496 may extend through the first to fifth insulating interlayers 190, 200, 330, 430 and 480, the etch stop pattern 184, the second insulation pattern 174 and the first gate mask 142 to contact an upper surface of a first metal pattern 132, and the fourth contact plug may extend through the first to fifth insulating interlayers 190, 200, 330, 430 and 480, the etch stop pattern 184 and the second insulation pattern 174 to contact the upper surface of the substrate 100.

The first to fourth wirings 512, 514, 516 and 518 may contact upper surfaces of the first to fourth contact plugs 492, 494, 496 and 498, respectively. In example embodiments, the first wiring 512 may extend in the second direction, and may serve as a bit line of the vertical memory device.

The first to fourth contact plugs 492, 494, 496 and 498 and the first to fourth wirings 512, 514, 516 and 518 may include a metal, e.g., tungsten, titanium, tantalum, etc., and/or a metal nitride, e.g., titanium nitride, tantalum nitride, tungsten nitride, etc.

As described above, the first and second insulating interlayers 190 and 200 on the second and third regions II and III of the substrate 100 may cover the first and second gate structures 152 and 154, and thus the cross-sections of the upper surfaces of the first and second insulating interlayers 190 and 200 may have a protrusion and depression shape, while the third insulating interlayer 330 on the second insulating interlayer 200 may have a flat upper surface. The protrusion and depression shape of the upper surface of the first insulating interlayer 190 may be a portion of a polygon at least partially angular, however, the protrusion and depression shape of the upper surface of the second insulating interlayer 200 may have be rounded.

The two insulating interlayers 190 and 200 may be formed between the third gate electrode 472 serving as a GSL and the fourth gate electrode 474 serving as a word line on the first region I of the substrate 100, and may include different materials from each other.

Figure 9:
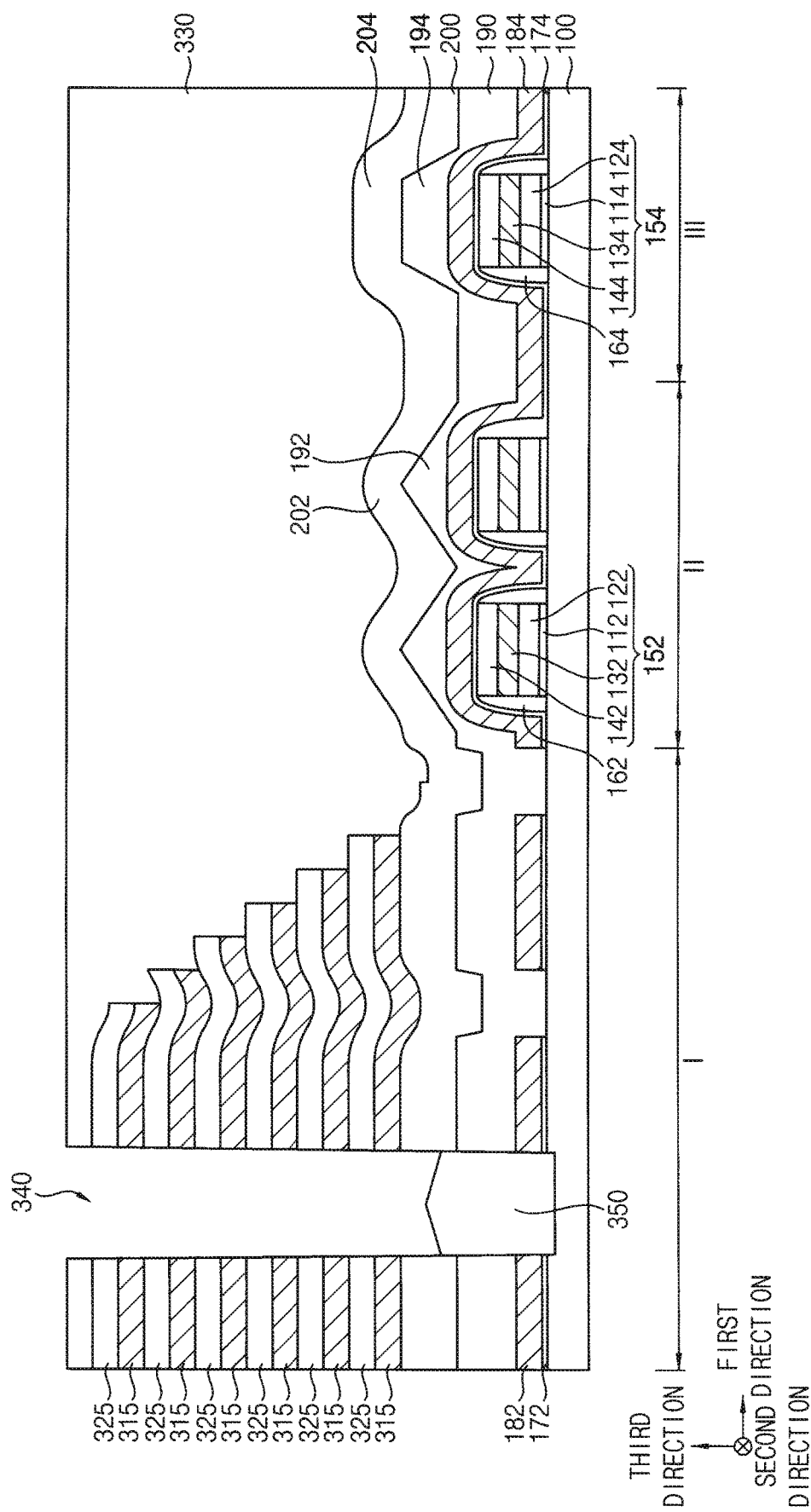
Figure 10:
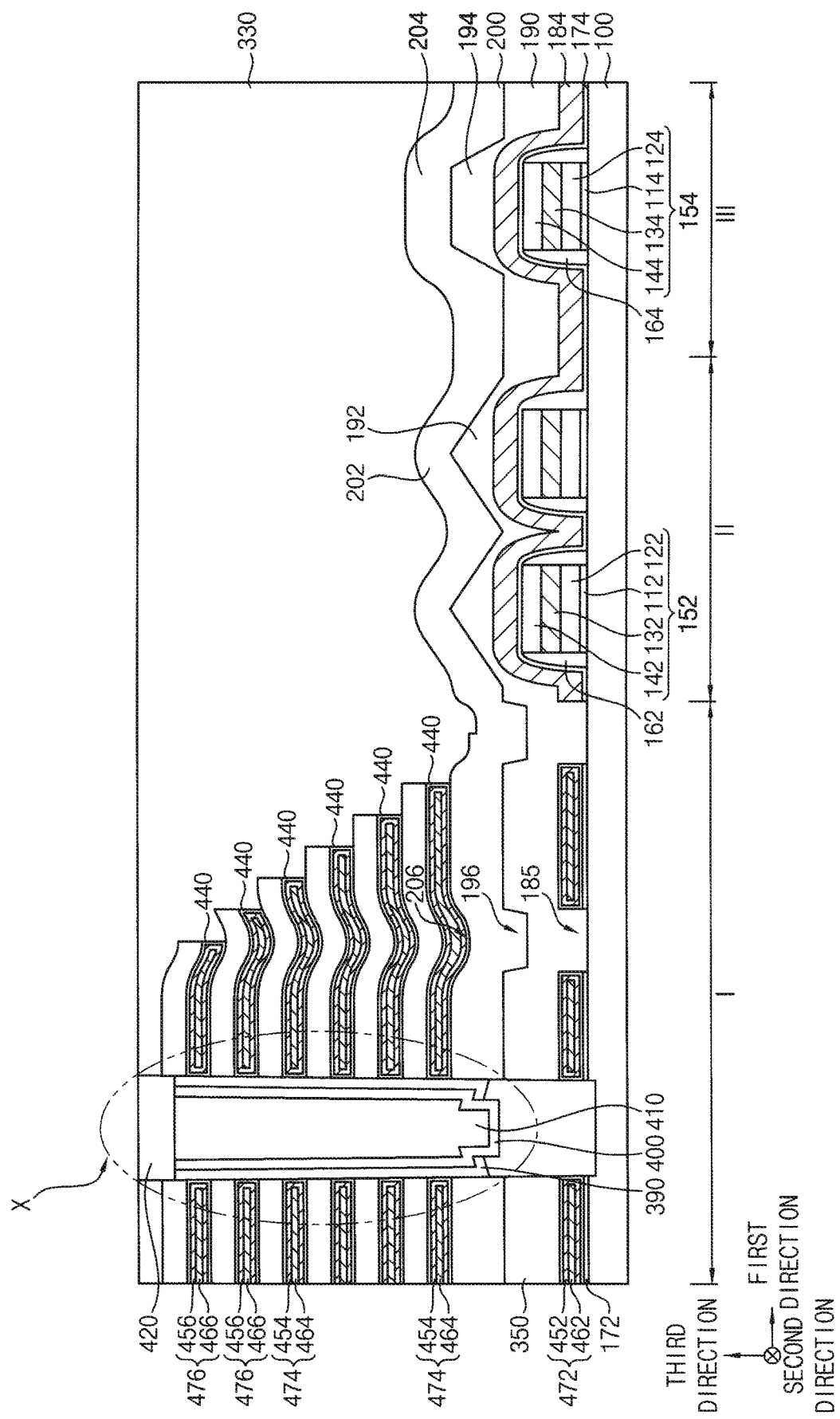
Figure 11:
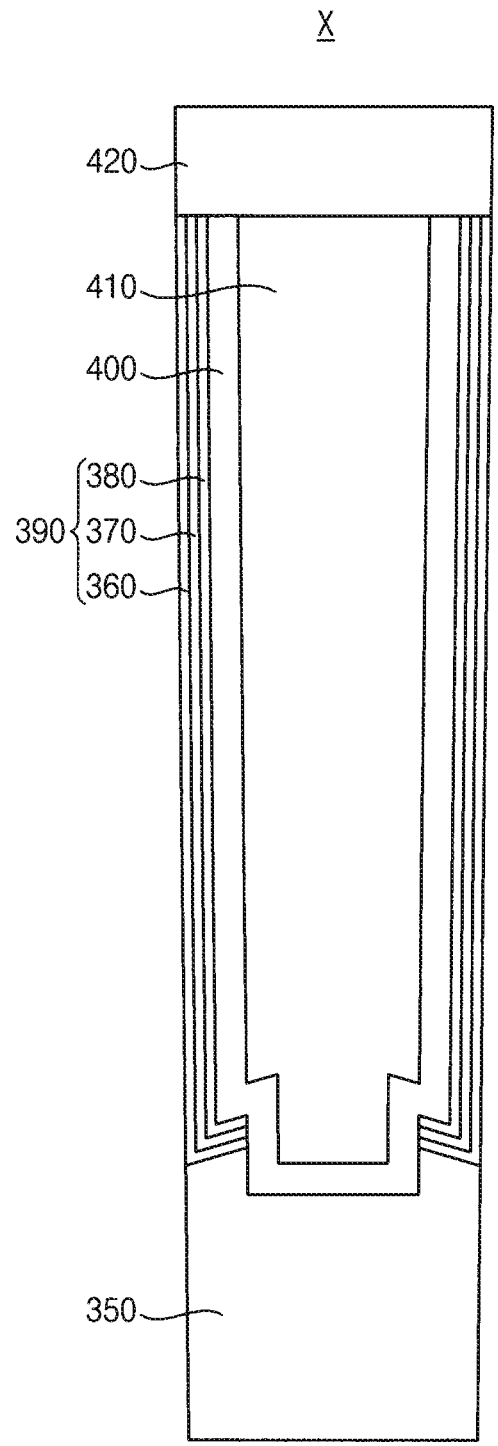

FIGS. 2 to 12 are cross-sectional views illustrating a method of manufacturing a vertical memory device in accordance with example embodiments. FIG. 11 is an enlarged cross-sectional view of a region X in FIG. 10.

Referring to FIG. 2, first and second gate structures 152 and 154 may be formed on second and third regions II and III, respectively, of a substrate 100 including a first region I and the second and third regions II and III.

A gate insulation layer, a polysilicon layer, a metal layer, and a gate mask layer may be sequentially stacked on the substrate 100, and may be patterned to form the first and second gate structures 152 and 154. The first gate structure 152 may include a first gate insulation pattern 112, a first polysilicon pattern 122, a first metal pattern 132, and a first gate mask 142 sequentially stacked, and the second gate structure 154 may include a second gate insulation pattern 114, a second polysilicon pattern 124, a second metal pattern 134, and a second gate mask 144 sequentially stacked.

First and second gate spacers 162 and 164 may be formed on sidewalls of the first and second gate structures 152 and 154, respectively. A gate spacer layer covering the first and second gate structures 152 and 154 may be formed on the substrate 100, and may be anisotropically etched to form the first and second gate spacers 162 and 164. The first and second gate spacers 162 and 164 may be formed to include an oxide, e.g., silicon oxide, and thus may be merged with the first and second gate masks 142 and 144.

Figure 3:
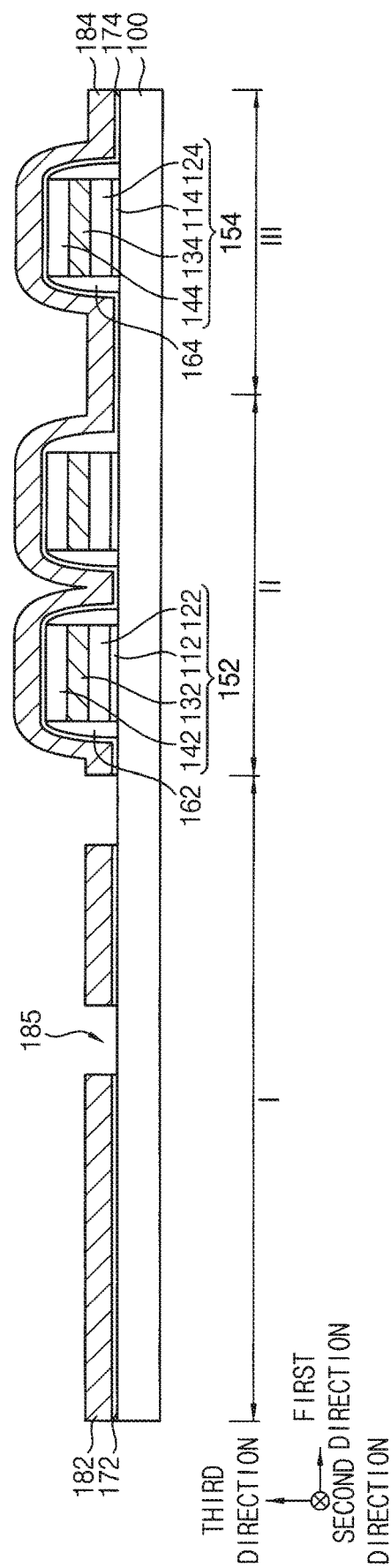

Referring to FIG. 3, a first insulation layer and an etch stop layer may be formed on the substrate 100 to cover the first and second gate structures 152 and 154, and may be patterned to form a first insulation pattern 172 and a first sacrificial pattern 182, respectively, sequentially stacked on the first region I of the substrate 100 and a second insulation pattern 174 and an etch stop pattern 184, respectively, sequentially stacked on the second region II of the substrate 100.

In example embodiments, the first insulation pattern 172 and the first sacrificial pattern 182 may have a rectangular shape on the first region I of the substrate 100 in a plan view, and the second insulation pattern 174 and the etch stop pattern 184 may cover the first and second gate structures 152 and 154 and the first and second gate spacers 162 and 164 on the second and third regions II and III of the substrate 100 in a plan view. However, a first opening 185 partially exposing an upper surface of the substrate 100 may be formed through the first insulation pattern 172 and the first sacrificial pattern 182. In example embodiments, a plurality of first openings 185 may be formed to be spaced apart from each other in the second direction.

The first insulation layer may include an oxide, e.g., silicon oxide, and thus may be merged with the first and second gate masks 142 and 144 and/or the first and second gate spacers 162 and 164.

Figure 4:
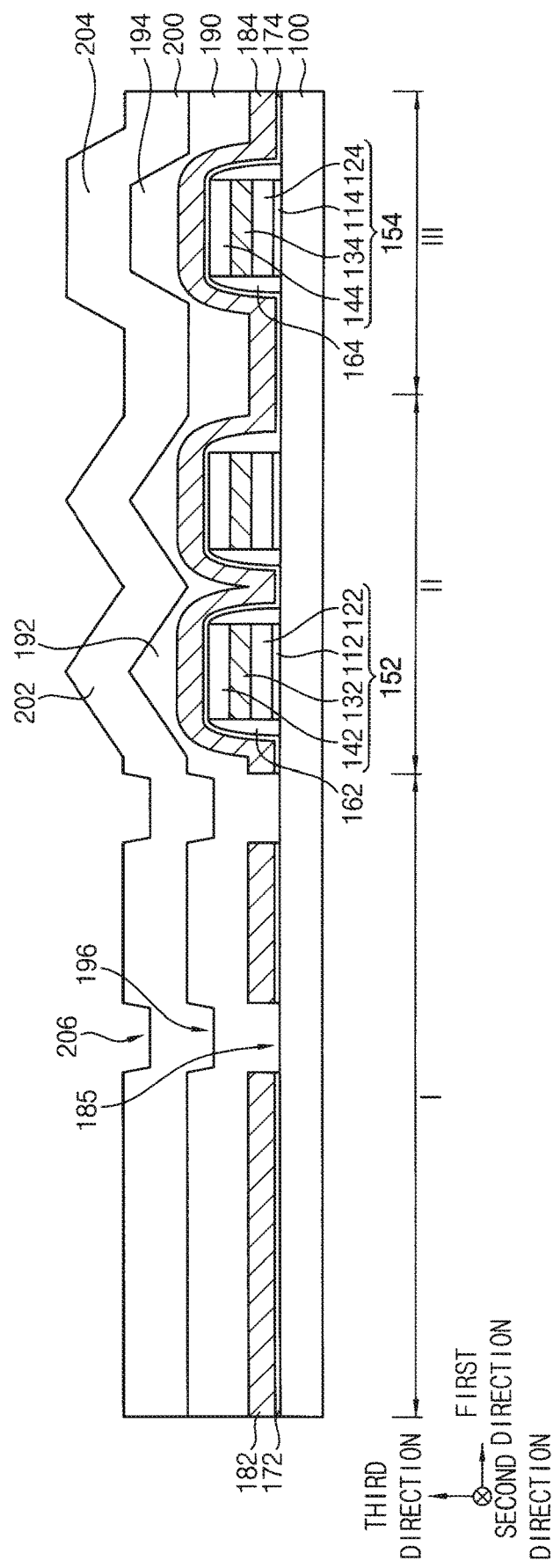

Referring to FIG. 4, a first insulating interlayer 190 covering the first and second insulation patterns 172 and 174, the first sacrificial pattern 182 and the etch stop pattern 184 may be formed on the substrate 100, and a second insulating interlayer 200 may be formed on the first insulating interlayer 190.

Each of the first and second insulating interlayers 190 and 200 may include a silicon oxide. In example embodiments, the first and second insulating interlayers 190 and 200 may include different materials from each other. For example, the first insulating interlayer 190 may be formed to include high density plasma (HDP) oxide, and the second insulating interlayer 200 may be formed to include TEOS.

The first insulating interlayer 190 may have a non-flat upper surface due to the first and second gate structures 152 and 154 on the second and third regions II and III of the substrate 100. That is, a portion of the first insulating interlayer 190 on the first and second gate structures 152 and 154 may have an upwardly protruding shape when compared to other portions thereof.

In example embodiments, an upper surface of at least a portion of the first insulating interlayer 190 on the second and third regions II and III of the substrate 100 may have a cross-section in one direction, for example, in the first direction, which may have an angular protrusion and depression shape.

A first concave portion 196 may be formed on the upper surface of the first insulating interlayer 190, corresponding to the first opening 185 through the first insulation pattern 172 and the first sacrificial pattern 182 on the first region I of the substrate 100. In example embodiments, a cross-section in the first direction of the first concave portion 196 on the upper surface of the first insulating interlayer 190 may have a shape of a portion of a polygon (including three sides neighboring with each other at an obtuse angle).

An upper surface of the second insulating interlayer 200 may have a shape corresponding to the shape of the upper surface of the first insulating interlayer 190. Thus, portions of the second insulating interlayer 200, which may be formed on the first and second gate structures 152 and 154 on the second and third regions II and III of the substrate 100, may upwardly protrude when compared to other portions thereof. In example embodiments, a cross-section of an upper surface of at least a portion of the second insulating interlayer 200 may have an angular protrusion and depression shape, and upper surfaces of third and fourth portions 202 and 204 of the second insulating interlayer 200 overlapping the first and second gate structures 152 and 154, respectively, in the third direction may have a cross-section in the first direction with a shape of a portion of a polygon.

The upper surface of the second insulating interlayer 200 may also have a second concave portion 206 corresponding to the first opening 185 through the first insulation pattern 172 and the first sacrificial pattern 182 on the first region I of the substrate 100. That is, the second concave portion 206 on the upper surface of the second insulating interlayer 200 may be formed to overlap the first concave portion 196 on the upper surface of the first insulating interlayer 190 in the third direction, and may have a cross-section in the first direction with a shape of a portion of a polygon (including three sides neighboring with each other at an obtuse angle).

Figure 5:
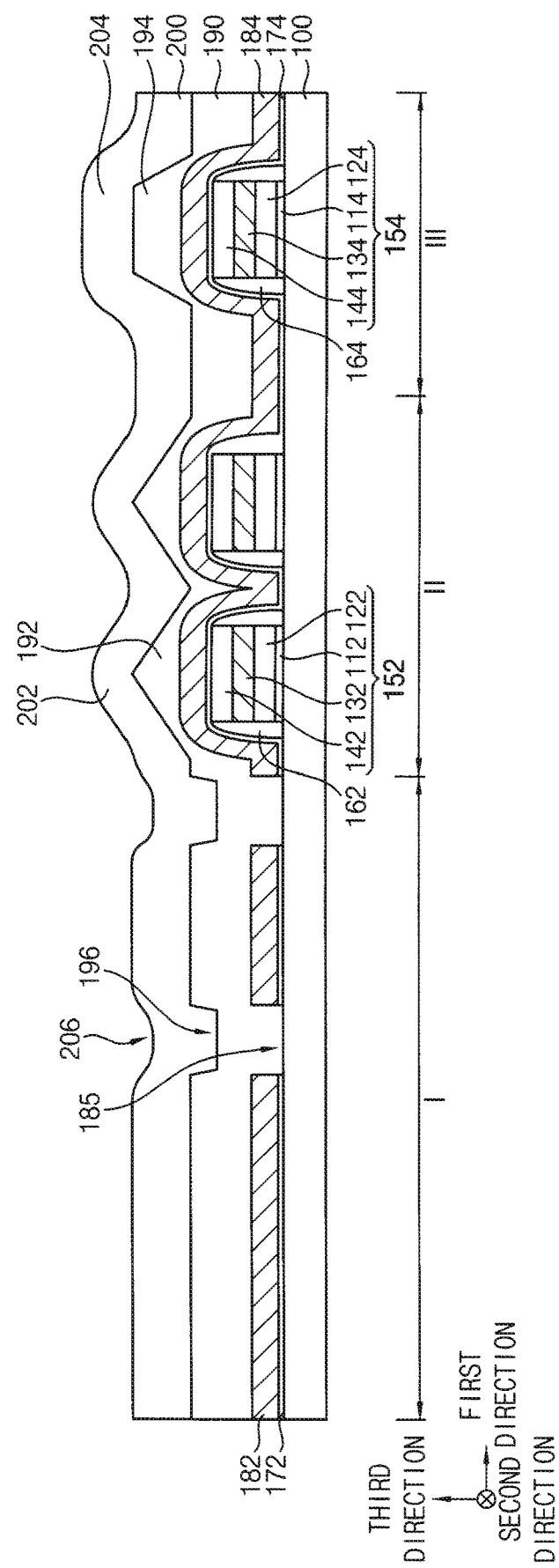

Referring to FIG. 5, a wet etching process may be performed on the upper surface of the second insulating interlayer 200, so that the second concave portion 206 on the first region I of the substrate 100 may have a smoothly curved surface.

That is, the shape of the cross-section in the first direction of the second concave portion 206 on the upper surface of the second insulating interlayer 200, which may be a shape of a portion of a polygon, may be transformed into a rounded concave shape by the wet etching process.

The shapes of the cross-sections in the first direction of the upper surfaces of the third and fourth portions 202 and 204 of the second insulating interlayer 200 on the second and third regions II and III of the substrate 100 may be transformed into a rounded convex shape by the wet etching process.

Figure 6:
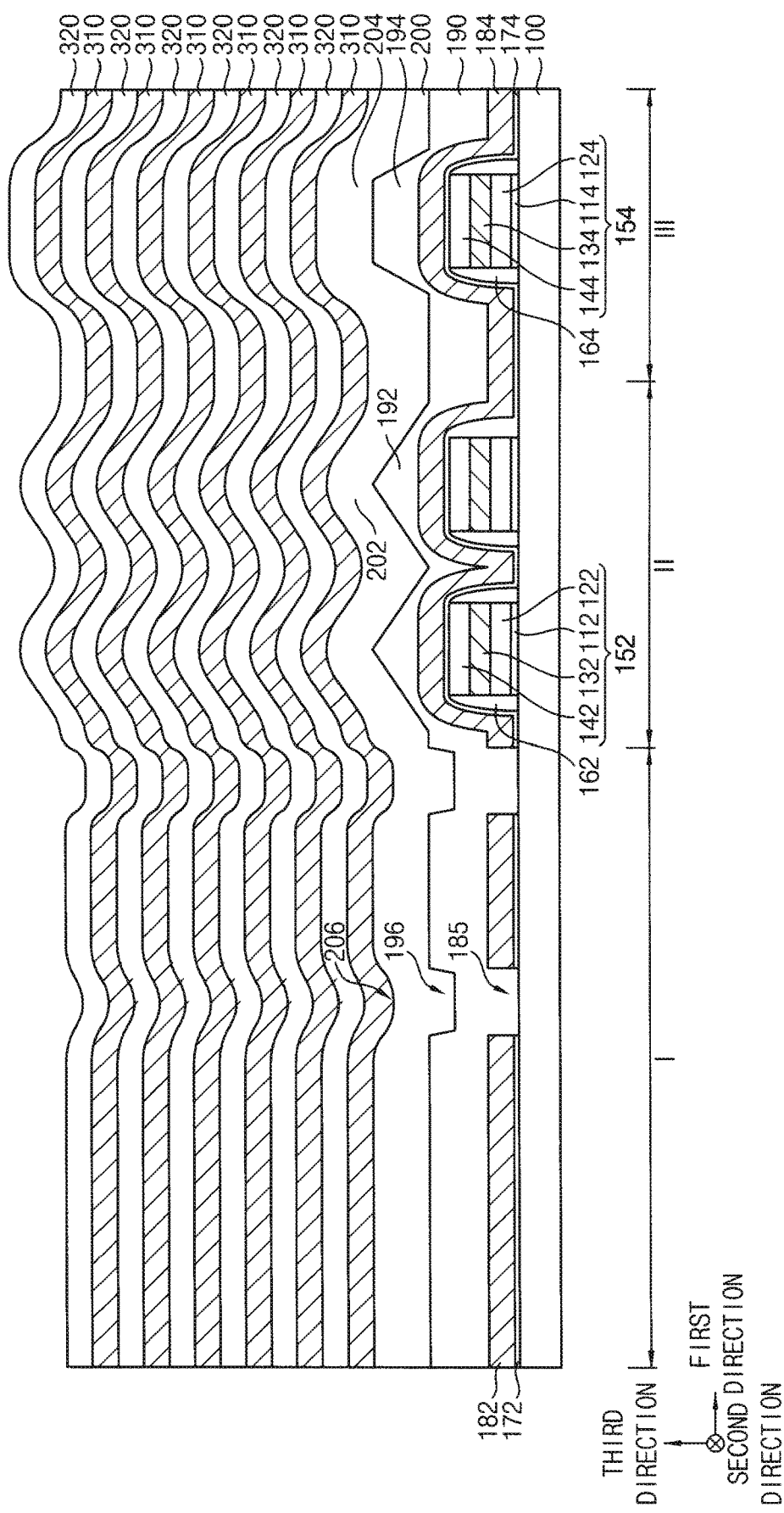

Referring to FIG. 6, a sacrificial layer 310 and a second insulation layer 320 may be alternately and repeatedly stacked on the second insulating interlayer 200. Accordingly, a plurality of sacrificial layers 310 and a plurality of second insulation layers 320 may be alternately stacked in the third direction. FIG. 6 shows the sacrificial layers 310 at six levels, respectively, and the second insulation layers 320 at six levels, respectively. However, the numbers of the sacrificial layers 310 and the second insulation layers 320 may not be limited thereto, and may be more or less than 6, respectively.

Each of the sacrificial layer 310 and the second insulation layer 320 may be formed to have a partially curved shape corresponding to the protrusion and depression shape of the upper surface of the second insulating interlayer 200 or the second concave portion 206.

The sacrificial layer 310 and the second insulation layer 320 may be formed by a process, e.g., a chemical vapor deposition (CVD) process, a plasma enhanced chemical vapor deposition (PECVD) process, an atomic layer deposition (ALD) process, etc.

The second insulation layer 320 may include a silicon oxide, e.g., TEOS, high density plasma (HDP) oxide, PEOX, etc., and the sacrificial layer 310 may include a material having an etching selectivity with respect to the second insulation layer 320, e.g., silicon nitride.

Figure 7:
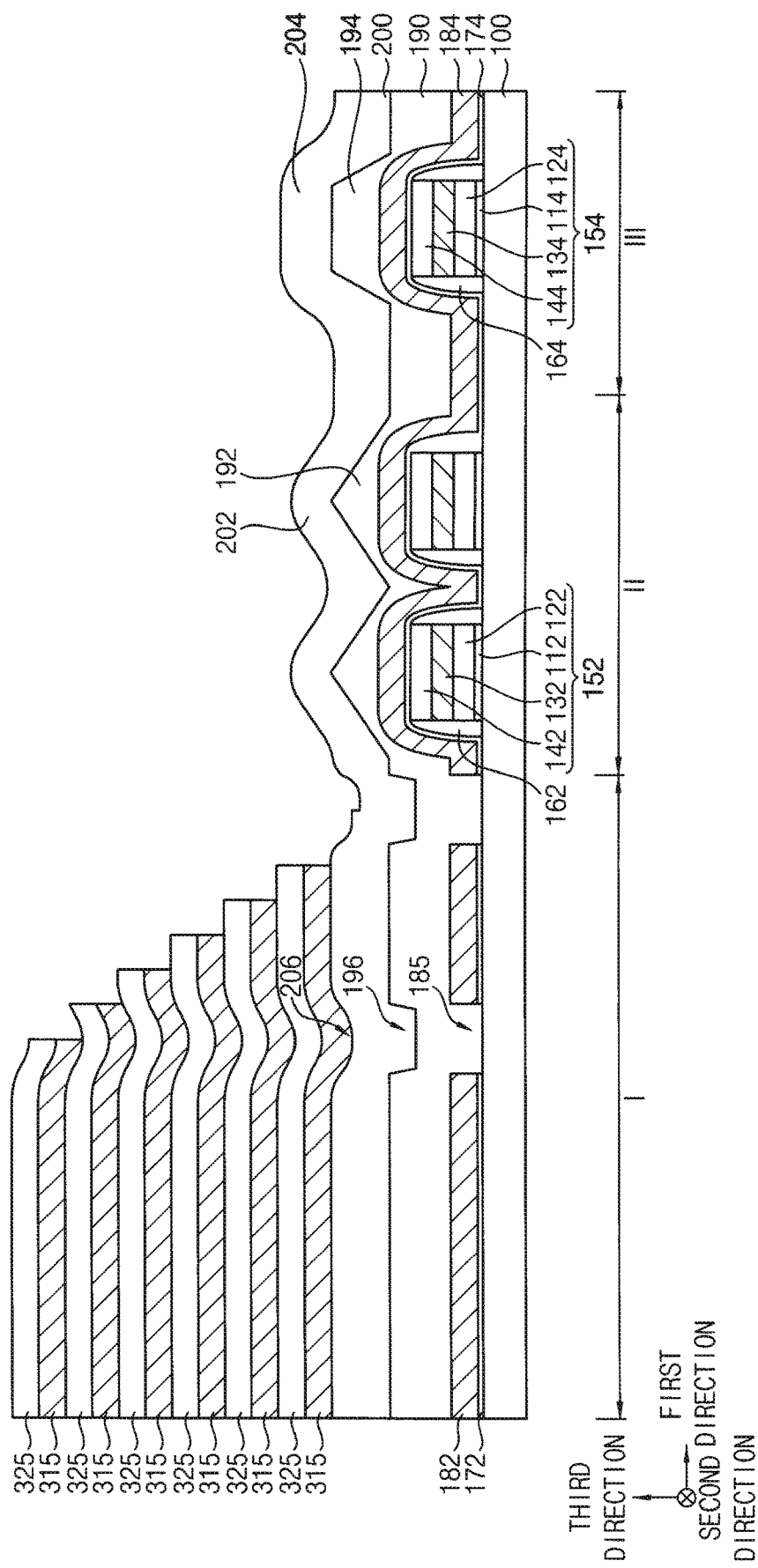

Referring to FIG. 7, a photoresist pattern (not shown) partially covering an uppermost one of the second insulation layers 320 may be formed on the uppermost one of the second insulation layers 320, and the uppermost one of the second insulation layers 320 and an uppermost one of the sacrificial layers 310 thereunder may be etched using the photoresist pattern as an etching mask. Accordingly, a portion of one of the second insulation layers 320 under the uppermost one of the sacrificial layers 310 may be exposed. After reducing a size of an area of the photoresist pattern by a given ratio, a trimming process in which the uppermost one of the second insulation layers 320, the uppermost one of the sacrificial layers 310, the exposed one of the second insulation layers 320 and one of the sacrificial layers 310 thereunder may be etched using the reduced photoresist pattern as an etching mask, may be performed. As the trimming process is repeatedly performed, a mold of a staircase shape including a plurality of steps each of which may include a second sacrificial pattern 315 and a third insulation pattern 325 sequentially stacked may be formed on the first region I of the substrate 100, and the upper surface of the second insulating interlayer 200 may be exposed on the second region II of the substrate 100.

In example embodiments, the steps included in the mold may have areas gradually decreasing at a constant ratio from a lowermost one toward an uppermost one thereof. The lowest one of the steps in the mold may have a smaller area than one of the steps including the first insulation pattern 172 and the first sacrificial pattern 182 in a plan view.

The mold may be formed by etching the sacrificial layer 310 and the second insulation layer 320 on the second insulating interlayer 200, so that no residue of the mold may remain on a boundary between the second and third regions II and III and the first region I of the substrate 100.

Figure 8:
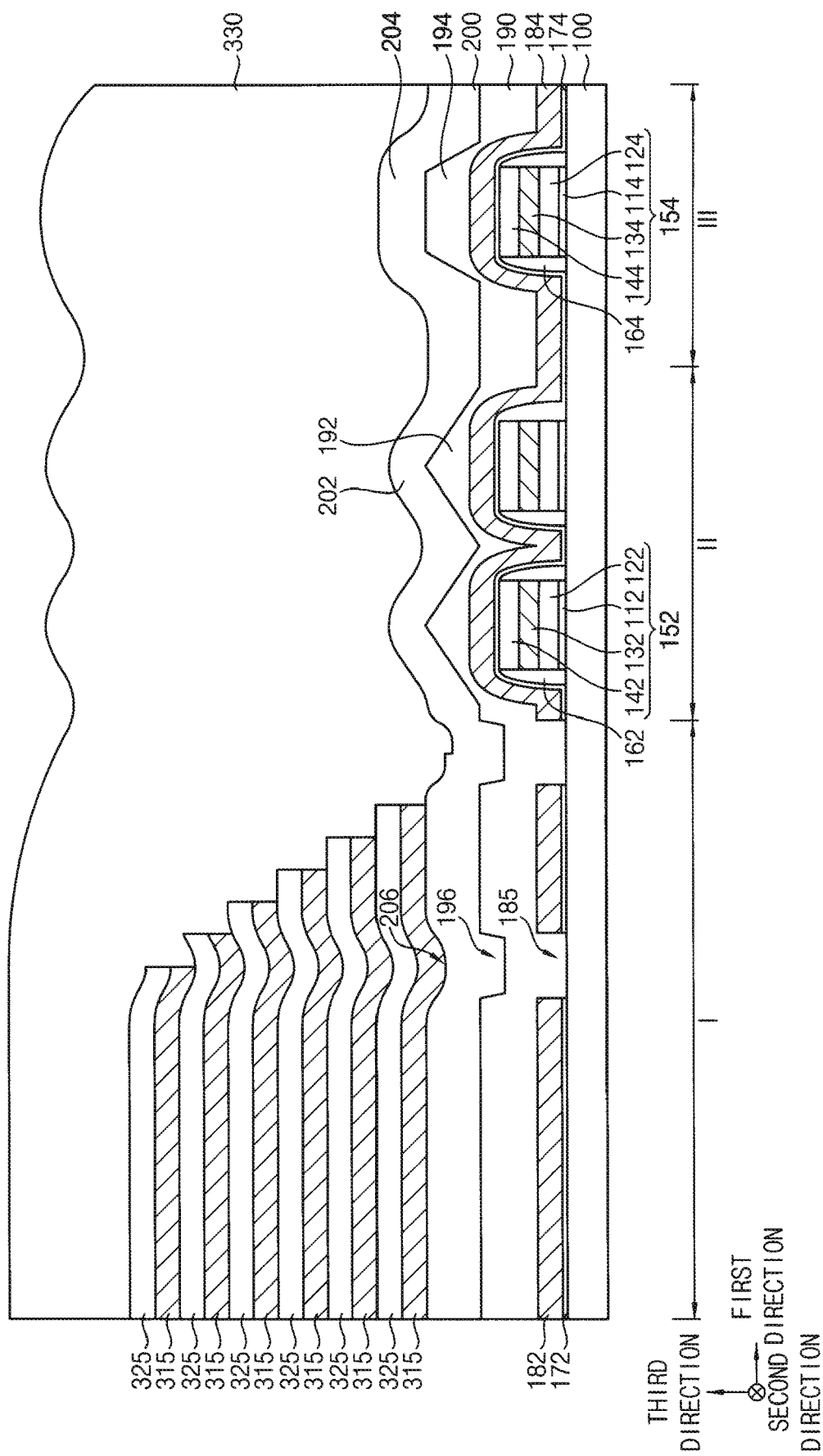

Referring to FIG. 8, a third insulating interlayer 330 covering the mold may be formed on the second insulating interlayer 200.

An upper surface of a portion of the third insulating interlayer 330 on the second and third regions II and III of the substrate 100 may have a protrusion and depression shape corresponding to that of the upper surface of the second insulating interlayer 200. The third insulating interlayer 330 may include a silicon oxide, e.g., TEOS, and thus may be merged with the underlying second insulating interlayer 200.

Referring to FIG. 9, a planarization process may be performed on an upper surface of the third insulating interlayer 330, and thus the upper surface of the third insulating interlayer 330 may become flat on the first to third regions I, II and III of the substrate 100.

The planarization process may include a chemical mechanical polishing (CMP) process and/or an etch back process, and may be performed until an upper surface of the uppermost one of the third insulation patterns 325 is exposed, or to a height higher than the upper surface of the uppermost one of the third insulation patterns 325.

A first mask (not shown) may be formed on the third insulating interlayer 330, and an etching process using the first mask as an etching mask may be performed on the third insulating interlayer 330, the third insulation patterns 325, the second sacrificial patterns 315, the second insulating interlayer 200, the first insulating interlayer 190, the first sacrificial pattern 182, and the first insulation pattern 172 to form a channel hole 340 therethrough, which may expose the first region I of the substrate 100.

A plurality of channel holes 340 may be formed in each of the first and second directions to form channel hole arrays.

A selective epitaxial growth (SEG) process may be performed to form an epitaxial layer 350 partially filling the channel hole 340.

In example embodiments, the SEG process may be performed using a silicon source gas, an etching gas and a carrier gas, and thus a single crystalline silicon layer may be formed as the epitaxial layer 350.

In the SEG process, for example, silane ($SiH_4$) gas, disilane ($Si_2H_6$) gas, dichlorosilane ($SiH_2Cl_2$) gas, etc., may be used as the silicon source gas, for example, hydrogen chloride (HCl) gas may be used as the etching gas, and, for example, hydrogen ($H_2$) gas may be used as the carrier gas.

In example embodiments, a height of an upper surface of the epitaxial layer 350 may be higher than a lower surface of the first insulating interlayer 190, and may be lower than the upper surface of the second insulating interlayer 200.

Referring to FIGS. 10 and 11, after removing the first mask, a first blocking layer, a charge storage layer, a tunnel insulation layer and a first spacer layer (not shown) may be sequentially formed on a sidewall of the channel hole 340, the upper surface of the epitaxial layer 350 and the upper surface of the third insulating interlayer 330, the first spacer layer may be anisotropically etched to form a first spacer (not shown) remaining on the sidewall of the channel hole 340 only, and the tunnel insulation layer, the charge storage layer and the first blocking layer may be etched using the first spacer as an etching mask to form a tunnel insulation pattern 380, a charge storage pattern 370 and a first blocking pattern 360 each of which may have a cup-like shape with a central lower surface opened on the epitaxial layer 350 and the sidewall of the channel hole 340. During the etching process, an upper portion of the epitaxial layer 350 may be partially removed. The tunnel insulation pattern 380, the charge storage pattern 370 and the first blocking pattern 360 may form a charge storage structure 390.

After removing the first spacer, a channel layer may be formed on the exposed epitaxial layer 350, the tunnel insulation pattern 380 and the third insulating interlayer 330, and a filling layer may be formed on the channel layer to fill a remaining portion of the channel hole 340.

The channel layer may be formed to include doped or undoped polysilicon or amorphous silicon. When the channel layer is formed to include amorphous silicon, a laser epitaxial growth (LEG) process or a solid phase epitaxy (SPE) process may be further performed to transform amorphous silicon into crystalline silicon.

The filling layer and the channel layer may be planarized until the upper surface of the third insulating interlayer 330 may be exposed to form a filling pattern 410 filling the remaining portion of the channel hole 340, and the channel layer may be transformed into a channel 400.

Accordingly, the charge storage structure 390, the channel 400 and the filling pattern 410 may be sequentially stacked on the epitaxial layer 350 in the channel hole 340. The charge storage structure 390 may be formed to have a cup-like shape of which a central lower surface is opened, the channel 400 may be formed to have a cup-like shape, and the filling pattern 410 may be formed to have a pillar shape.

According as the channel holes 340 for forming the channel 400 form the channel hole array, the channel 400 may also form a channel array corresponding thereto.

An upper portion of a first structure including the filling pattern 410, the channel 400, and the charge storage structure 390 may be removed to form a trench (not shown), and a capping pattern 420 may be formed to fill the trench.

Specifically, after the upper portion of the first structure is removed by an etch back process to form the trench, a capping layer may be formed on the first structure and the third insulating interlayer 330 to fill the trench, and an upper portion of the capping layer may be planarized until the upper surface of the third insulating interlayer 330 may be exposed to form the capping pattern 420. In example embodiments, the capping layer may be formed to include doped or undoped polysilicon or amorphous silicon, and when the capping layer is formed to include amorphous silicon, a crystallization process may be further performed.

The first structure, the epitaxial layer 350 and the capping pattern 420 in the channel hole 340 may be defined as a second structure.

Figure 12:
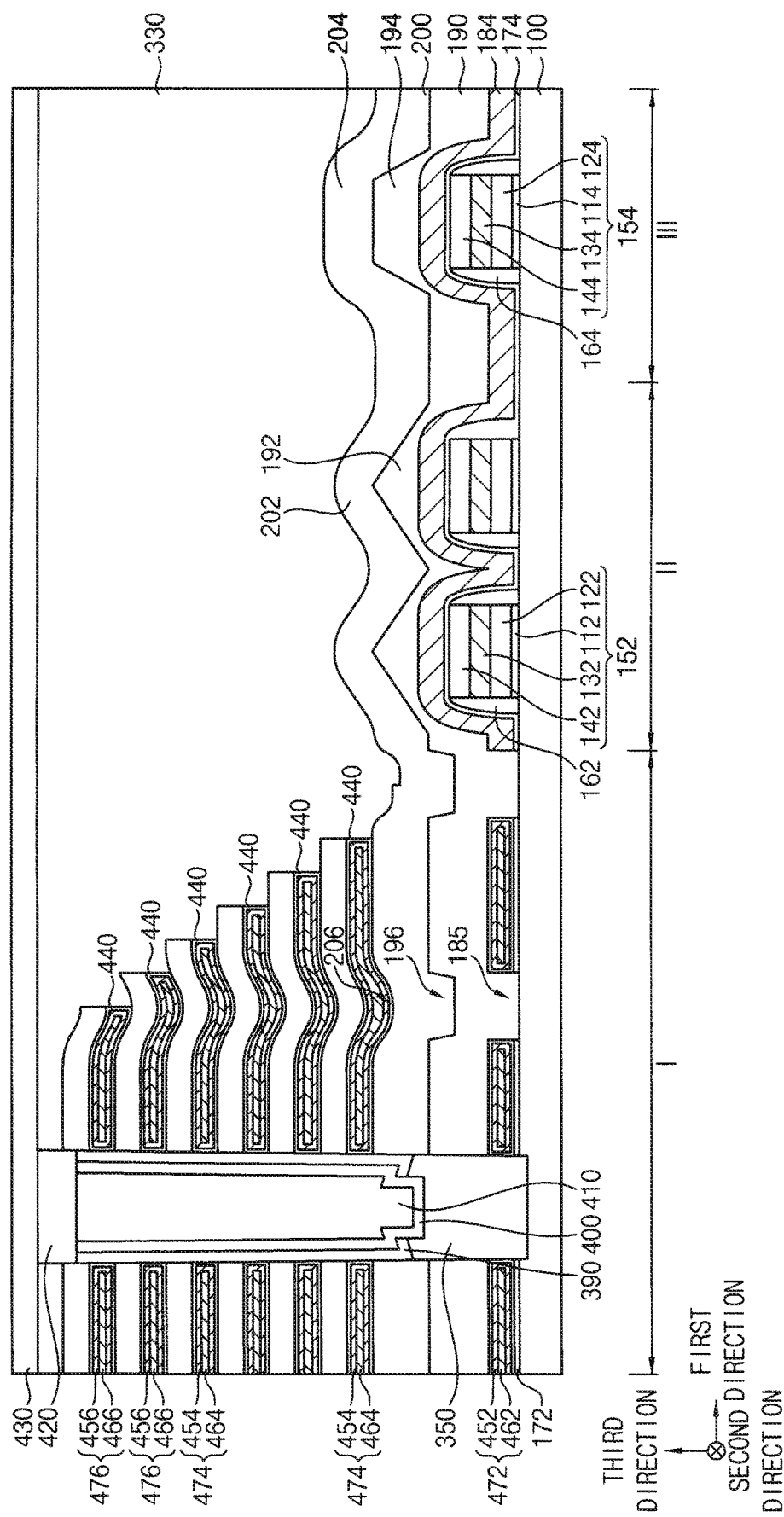

Referring to FIG. 12, a fourth insulating interlayer 430 may be formed on the third insulating interlayer 330 and the capping pattern 420. After forming a second mask (not shown) on the fourth insulating interlayer 430, a second opening (not shown) may be formed through the fourth insulating interlayer 430, the third insulation patterns 325, the second sacrificial patterns 315, the second insulating interlayer 200, the first insulating interlayer 190, the first sacrificial pattern 182, and the first insulation pattern 172 to expose the upper surface of the substrate 100 using the second mask as an etching mask. The fourth insulating interlayer 430 may include an oxide, e.g., silicon oxide, and thus may be merged with the underlying third insulating interlayer 330.

In example embodiments, the second opening may be formed to extend in the first direction on the first region I of the substrate 100, and a plurality of second openings may be formed in the second direction.

After removing the second mask, the first and second sacrificial patterns 182 and 315 exposed by the second opening may be removed to form a gap (not shown) between the third insulation patterns 325 at a plurality of levels, between the second insulating interlayer 200 and a lowermost one of the third insulation patterns 325, and between the first insulating interlayer 190 and the first insulation pattern 172, and a portion of an outer sidewall of the first blocking pattern 360 and a portion of a sidewall of the epitaxial layer 350 may be exposed by the gap. In example embodiments, the first and second sacrificial patterns 182 and 315 exposed by the second opening may be removed by a wet etching process using an etchant including phosphoric acid or sulfuric acid.

A second blocking layer 440 may be formed on the exposed outer sidewall of the first blocking pattern 360, the exposed sidewall of the epitaxial layer 350, an inner wall of the gap, surfaces of the first and third insulation patterns 172 and 325, the exposed upper surface of the substrate 100, and an upper surface of the fourth insulating interlayer 430, a gate barrier layer may be formed on the second blocking layer 440, and a gate conductive layer may be formed on the gate barrier layer to fill a remaining portion of the gap.

The gate conductive layer and the gate barrier layer may be partially removed to form a gate conductive pattern and a gate barrier pattern, respectively, in the gap, which may form a cell gate electrode. In example embodiments, the gate conductive layer and the gate barrier layer may be partially removed by a wet etching process.

In example embodiments, the cell gate electrode may extend in the first direction, and a plurality of cell gate electrodes may be formed in the second direction. That is, the plurality of the cell gate electrodes each of which may extend in the first direction may be spaced apart from each other in the second direction by the second opening.

The cell gate electrode may include third to fifth gate electrodes 472, 474 and 476 sequentially stacked in the third direction. The third gate electrode may be formed at a lowermost level, each of the fourth and fifth gate electrodes 474 and 476 may be formed on the third gate electrode 472 at one or a plurality of levels, respectively. In example embodiments, the fifth gate electrode 476 may be formed at an uppermost level and a level thereunder, and the fourth gate electrode 474 may be formed at a plurality of levels between the third gate electrode 472 and the fifth gate electrodes 476.

Impurities may be implanted into an upper portion of the substrate 100 exposed by the second opening to form an impurity region (not shown). In example embodiments, the impurities may include an n-type impurity, e.g., phosphorus, arsenic, etc.

A second spacer layer (not shown) may be formed on the upper surface of the substrate 100 exposed by the second opening, a sidewall of the second opening and the upper surface of the fourth insulating interlayer 430, and the second spacer layer may be anisotropically etched to form a second spacer (not shown) on the sidewall of the second opening. Accordingly, a portion of the impurity region at the upper portion of the substrate 100 may be exposed.

A common source line (CSL) (not shown) may be formed on the exposed impurity region to fill a remaining portion of the second opening. In example embodiments, a conductive layer may be formed on the exposed upper surface of the impurity region, the second spacer and the fourth insulating interlayer 430 to fill the second opening, and an upper portion of the conductive layer may be planarized until the upper surface of the fourth insulating interlayer may be exposed to form the CSL. During the planarization process, a portion of the second blocking layer 440 on the upper surface of the fourth insulating interlayer 430 may be also removed. The CSL may be formed in the second opening, and may contact the upper surface of the impurity region.

Referring again to FIGS. 1A and 1B, after forming a fifth insulating interlayer 480 on the fourth insulating interlayer 430, the CSL, the second spacer and the second blocking layer 440, a first contact plug 492 may be formed through the fourth and fifth insulating interlayers 430 and 480 to contact an upper surface of the capping pattern 420. A second contact plug 494 may be formed through the third to fifth insulating interlayers 330, 430 and 480, the third insulation pattern 325, the second blocking layer 440 and the fourth and fifth gate barrier patterns 454 and 456 to contact one of upper surfaces of fourth and fifth gate conductive patterns 464 and 466, or may be formed through the first to fifth insulating interlayers 190, 200, 330, 430 and 480, the second blocking layer 440 and the third gate barrier pattern 452 to contact an upper surface of the third gate conductive pattern 462.

Also, a third contact plug 496 may be formed through the first to fifth insulating interlayers 190, 200, 330, 430 and 480, the etch stop pattern 184, the second insulation pattern 174 and the first gate mask 142 to contact an upper surface of the first metal pattern 132, and a fourth contact plug 498 may be formed through the first to fifth insulating interlayers 190, 200, 330, 430 and 480, the etch stop pattern 184 and the second insulation pattern 174 to contact the upper surface of the substrate 100.

Each of the second contact plugs 494 may be formed on each of the pads having a staircase shape. That is, each of the second contact plugs 494 may be formed on a portion of each pad not covered by higher pads.

A sixth insulating interlayer 500 may be formed on the fifth insulating interlayer 480 and the first to fourth contact plugs 492, 494, 496 and 498, and first to fourth wirings 512, 514, 516 and 518 may be formed through the sixth insulating interlayer 500 to contact upper surfaces of the first to fourth contact plugs 492, 494, 496 and 498, respectively, which may complete the fabrication of the vertical memory device. In example embodiments, the first wiring 512 may extend in the second direction, and may serve as a bit line of the vertical memory device.

As described above, in the method of manufacturing the vertical memory device, even if the upper surfaces of the first and second insulating interlayers 190 and 200 covering the first and second gate structure 152 and 154 on the second and third regions II and III of the substrate 100 may not be flat due to the first and second gate structures 152 and 154, a planarization process for planarizing the upper surfaces of the first and second insulating interlayers 190 and 200 may not be performed immediately. On the other hand, after forming the third insulating interlayer 330 on the second insulating interlayer 200 to cover the mold on the first region I of the substrate 100, the planarization process may be performed.

Accordingly, the planarization process may be performed only after forming the first and second sacrificial patterns 182 and 315 included in the mold for forming the cell gate electrodes, that is, the third to fifth gate electrodes 472, 474 and 476, so that the degradation of characteristics by the planarization process, for example, scratches on the layers on the first region I of the substrate 100, may be prevented.

The angular protrusion and depression shape of the second concave portion 206 of the upper surface of the second insulating interlayer 200, which may be formed due to the first opening 185 on the first region I of the substrate 100, may be transformed into a rounded protrusion and depression shape by a wet etching process, and thus the degradation of characteristics due to the concentration of electric field may be alleviated.

Figure 13:
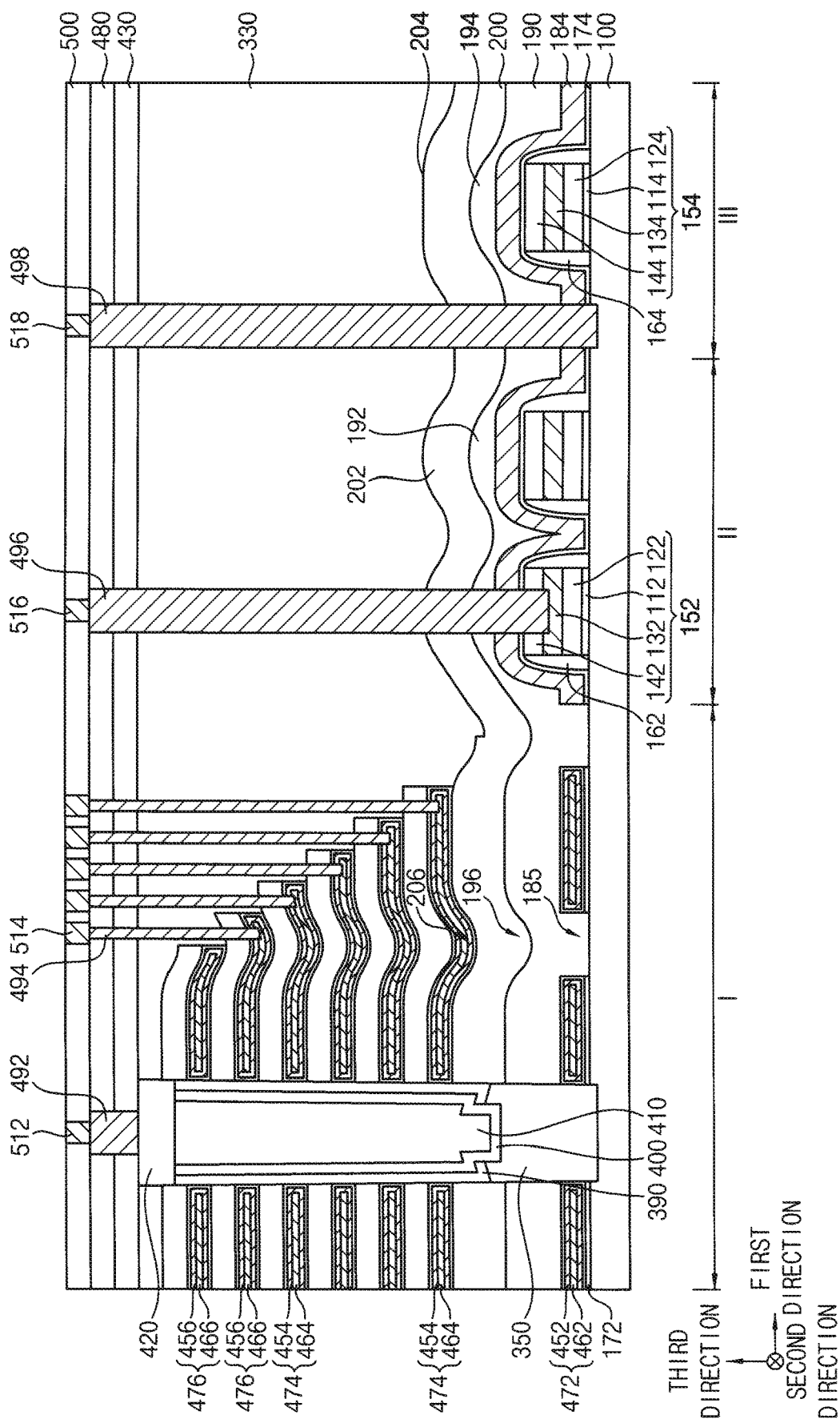
FIG. 13 is a cross-sectional view illustrating a vertical memory device in accordance with example embodiments.

FIG. 13 is a cross-sectional view illustrating a vertical memory device in accordance with example embodiments.

The vertical memory device may be the substantially same as or similar to the vertical memory device described with reference to FIGS. 1A and 1B, except for the shape of the upper surface of the first insulating interlayer 190. Accordingly, like reference numerals refer to like elements, and detailed descriptions thereon are omitted herein.

Referring to FIG. 13, portions of the first insulating interlayer 190 on the first and second gate structures 152 and 154 on the second and third regions II and III of the substrate 100 may relatively protrude upwardly in comparison with other portions thereof.

However, unlike the first insulating interlayer 190 described in FIG. 1A, an upper surface of the first insulating interlayer 190 described in FIG. 13 may have a smoothly curved shape instead of an angular protrusion and depression shape. For example, upper surfaces of the first and second portions 192 and 194, which may overlap the first and second gate structures 152 and 154 on the first insulating interlayer 190 in the third direction, may have a cross-section in the first direction having a rounded curved shape corresponding to the shape of a portion of a polygon.

The first concave portion 196 on the upper surface of the first insulating interlayer 190 corresponding to the first opening 185 may also have a cross-section having a rounded curved shape corresponding to the shape of a portion of a polygon.

Figure 14:
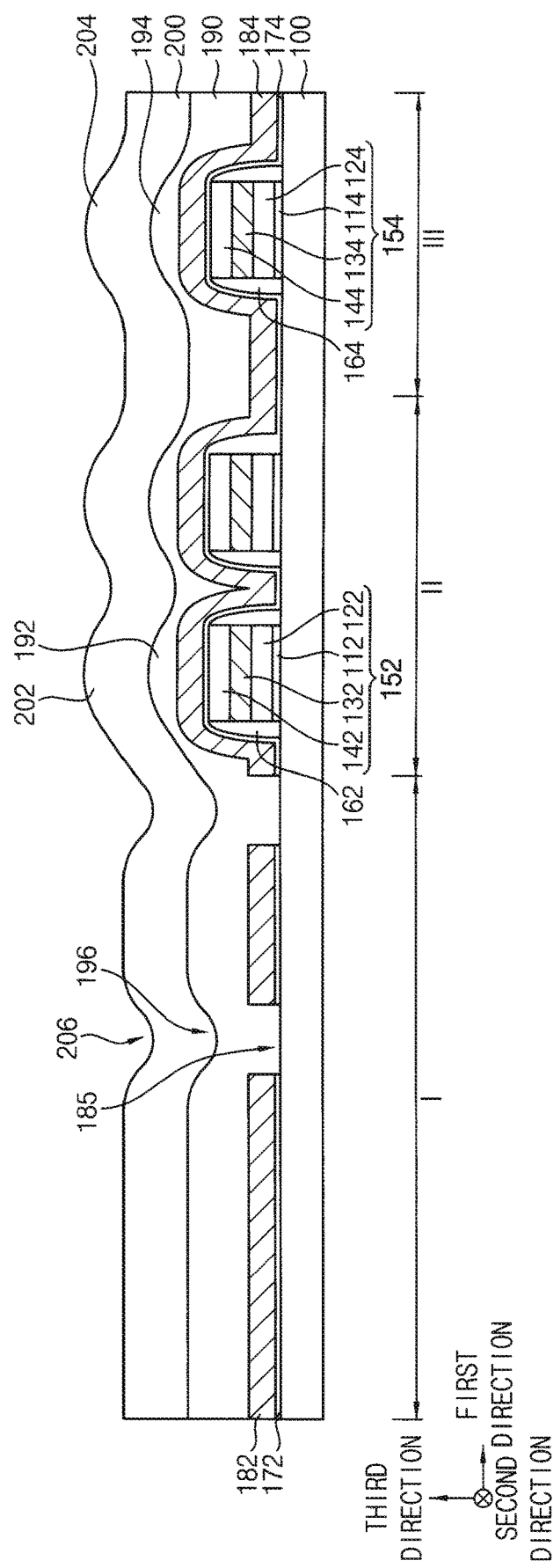
FIG. 14 is a cross-sectional view illustrating a method of manufacturing a vertical memory device in accordance with example embodiments.

FIG. 14 is a cross-sectional view illustrating a method of manufacturing a vertical memory device in accordance with example embodiments.

This method of manufacturing the vertical memory device may include processes substantially same as or similar to the processes described with reference to FIGS. 2 to 12 and FIGS. 1A and 1B, so that detailed descriptions thereon are omitted herein.

Referring to FIG. 14, processes substantially same as or similar to the processes described with reference to FIGS. 2 to 4 may be performed.

However, before forming the second insulating interlayer 200 on the first insulating interlayer 190, an additional etching process may be performed on the upper portion of the first insulating interlayer 190 so that the angular protrusion and depression shape may be transformed into a rounded protrusion and depression shape.

In example embodiments, the etching process may include a wet etching process.

Processes substantially same as or similar to the processes described with reference to FIGS. 5 to 12 and FIGS. 1A and 1B may be performed to complete the fabrication of the vertical memory device.

Figure 15:
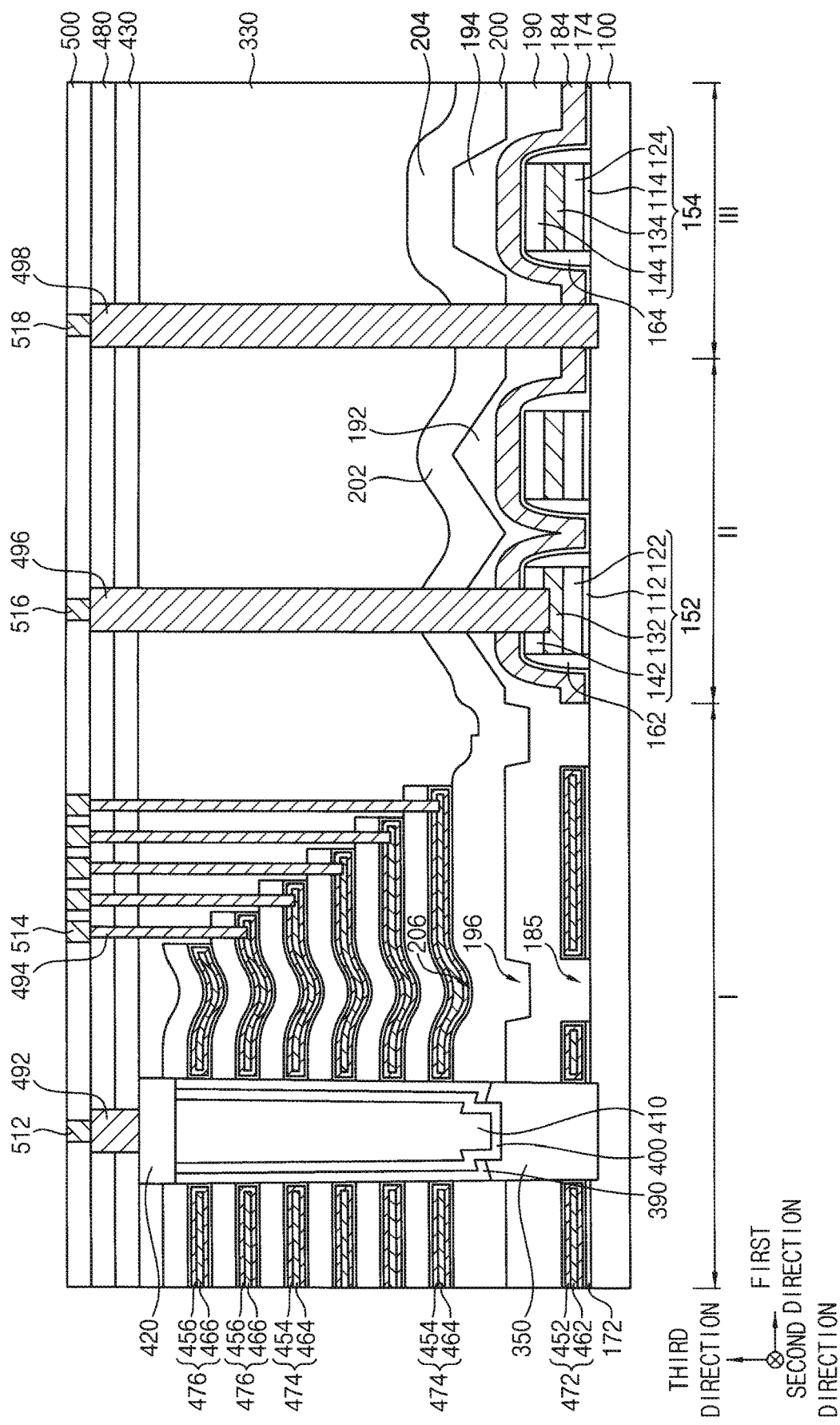
FIG. 15 is a cross-sectional view illustrating a vertical memory device in accordance with example embodiments.

FIG. 15 is a cross-sectional view illustrating a vertical memory device in accordance with example embodiments.

This vertical memory device may be substantially same as or similar to the vertical memory device described in FIGS. 1A and 1B, except for the positions of the first opening, and the first and second concave portions. Accordingly, like reference numerals refer to like elements, and detailed descriptions thereon are omitted herein.

Referring to FIG. 15, the first opening 185 partially exposing the upper surface of the substrate 100 may be formed through the third gate electrode 472 and the underlying first insulation pattern 172, which may be closer to a central portion rather than an edge portion of the first region I of the substrate 100, when compared to the first opening described in FIG. 1A.

Accordingly, the first and second concave portions 196 and 206 may be also formed to be closer to the central portion of the first region I of the substrate 100 correspondingly to the first opening 185, and each of the pads contacting the second contact plugs 294 may have a flat upper surface.

Figure 16:
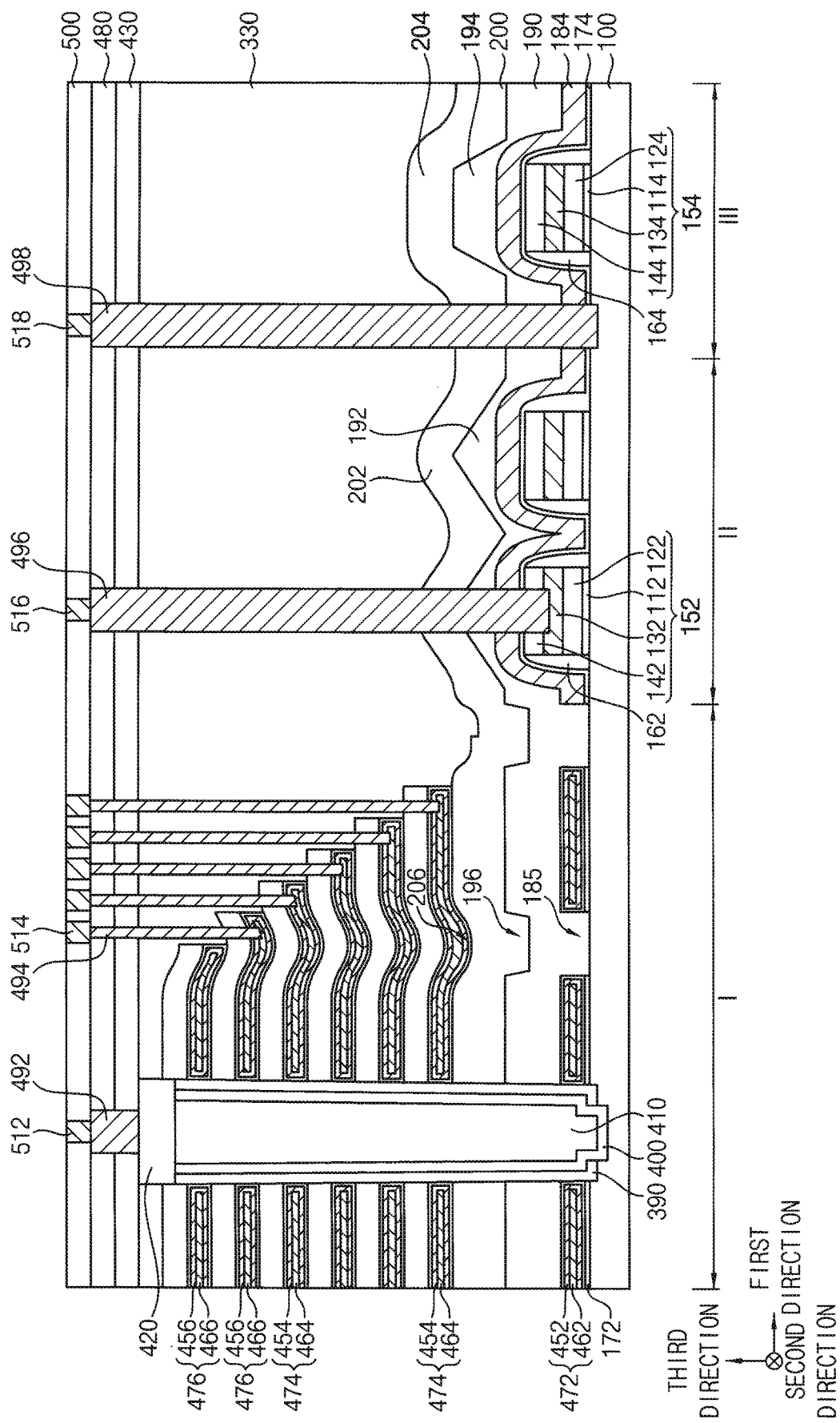
FIG. 16 is a cross-sectional view illustrating a vertical memory device in accordance with example embodiments.

FIG. 16 is a cross-sectional view illustrating a vertical memory device in accordance with example embodiments. This vertical memory device may be substantially the same as or similar to the vertical memory device described in FIGS. 1A and 1B, except for the epitaxial layer, the channel and the charge storage structure. Accordingly, like reference numerals refer to like elements, and detailed descriptions thereon are omitted herein.

Referring to FIG. 16, the vertical memory device may not include the epitaxial layer 350 described in FIGS. 1A and 1B. Accordingly, the channel 400 may be formed to have a cup-like shape contacting the upper surface of the substrate 100, and the charge storage structure 390 may be formed to have a cup-like shape of which a central lower surface is opened. The charge storage structure 390 may cover an outer sidewall of the channel 400, and may contact the upper surface of the substrate 100.

As described above, although the inventive concepts have been described, those skilled in the art will readily appreciate that many modifications are possible in the example embodiments without materially departing from the novel teachings and advantages of the present inventive concepts.

What is claimed is:

1. A vertical memory device, comprising:
   a gate structure including a first gate electrode on a peripheral circuit region of a substrate, the substrate containing a cell region and the peripheral circuit region;
   a plurality of second gate electrodes sequentially stacked on the cell region of the substrate, the plurality of second gate electrodes spaced apart from each other in a vertical direction to an upper surface of the substrate;
   a channel extending in the vertical direction on the cell region of the substrate and extending through at least one of the second gate electrodes; and
   a first insulating interlayer covering the gate structure on the peripheral circuit region of the substrate, a cross-section in one direction of an upper surface of a portion of the first insulating interlayer overlapping the gate structure in the vertical direction having a shape of a portion of a polygon.

2. The vertical memory device of claim 1, further comprising:
   a second insulating interlayer on the first insulating interlayer,
   wherein a cross-section in the direction of an upper surface of a portion of the second insulating interlayer has a curved shape corresponding to that of the upper surface of the portion of the first insulating interlayer.

3. The vertical memory device of claim 2, wherein the first and second insulating interlayers include high density plasma (HDP) oxide and TEOS, respectively.

4. The vertical memory device of claim 2, further comprising:
   a third insulating interlayer on the second insulating interlayer,
   wherein the third insulating interlayer has a flat upper surface.

5. The vertical memory device of claim 4, wherein the second and third insulating interlayers include substantially the same material.

6. The vertical memory device of claim 1, wherein the second gate electrodes include third to fifth gate electrodes sequentially stacked on the substrate in the vertical direction, and
   wherein the first insulating interlayer is also on the cell region of the substrate to cover the third gate electrode.

7. The vertical memory device of claim 6, further comprising:
   a second insulating interlayer between the first insulating interlayer and the fourth gate electrode.

8. The vertical memory device of claim 7, wherein the first and second insulating interlayers include high density plasma (HDP) oxide and TEOS, respectively.

9. The vertical memory device of claim 7, wherein an upper surface of a portion of each of the first and second insulating interlayers has a concave shape on the cell region of the substrate.

10. The vertical memory device of claim 9, wherein a concave portion of the upper surface of the first insulating interlayer has a cross-section in the direction having a shape of a portion of a polygon, and a concave portion of the upper surface of the second insulating interlayer has a cross-section in the direction with a curved shape corresponding to the shape of the cross-section of the concave portion of the upper surface of the first insulating interlayer.

11. The vertical memory device of claim 9, wherein one or ones of the fourth gate electrodes have a concave portion.

12. The vertical memory device of claim 6, wherein the third, the fourth and the fifth gate electrodes serve as a ground selection line (GSL), a word line, and a string selection line (SSL), respectively.

13. A vertical memory device, comprising:
   a gate structure including a first gate electrode on a peripheral circuit region of a substrate, the substrate containing a cell region and the peripheral circuit region;
   a second gate electrode on the cell region of the substrate;
   a first insulating interlayer on the cell region and the peripheral circuit region of the substrate, the first insulating interlayer covering the gate structure and the second gate electrode;
   a second insulating interlayer on the first insulating interlayer;
   third and fourth gate electrodes sequentially stacked on a portion of the second insulating interlayer on the cell region of the substrate, the third and fourth gate electrodes spaced apart from each other in a vertical direction to an upper surface of the substrate; and
   a channel extending through the third and fourth gate electrodes in the vertical direction,
   wherein an upper surface of at least a portion of the first insulating interlayer on the peripheral circuit region of the substrate has an angular protrusion and depression shape.

14. The vertical memory device of claim 13, wherein an upper surface of the portion of the second insulating interlayer on the peripheral circuit region of the substrate has a rounded protrusion and depression shape corresponding to the shape of the upper surface of the at least a portion of the first insulating interlayer.

15. The vertical memory device of claim 13, wherein the first and second insulating interlayers include high density plasma (HDP) oxide and TEOS, respectively.

16. The vertical memory device of claim 13, further comprising:
   a third insulating interlayer covering the third and fourth gate electrodes on the second insulating interlayer, wherein the third insulating interlayer has a flat upper surface.

17. The vertical memory device of claim 13, wherein the second, the third, and the fourth gate electrodes serve as a ground selection line (GSL), a word line, and string selection line (SSL), respectively.

18. A vertical memory device, comprising:
   a gate structure including a first gate electrode on a peripheral circuit region of a substrate, the substrate containing a cell region and the peripheral circuit region;
   a plurality of second gate electrodes sequentially stacked on the cell region of the substrate, the plurality of second gate electrodes spaced apart from each other in a vertical direction to an upper surface of the substrate;
   a channel extending through at least one of the second gate electrodes in the vertical direction on the cell region of the substrate; and
   first to third insulating interlayers sequentially stacked on the peripheral circuit region of the substrate,
   wherein the first insulating interlayer covers the gate structure, and an upper surface of at least a portion of the first insulating interlayer has an angular protrusion and depression shape,
   wherein an upper surface of a portion of the second insulating interlayer has a rounded protrusion and depression shape corresponding to that of the upper surface of the at least a portion of the first insulating interlayer, and
   wherein the third insulating interlayer has a flat upper surface.

19. The vertical memory device of claim 18, wherein the second and third insulating interlayers include substantially the same material, which is different from a material of the first insulating interlayer.

20. The vertical memory device of claim 18, wherein the second gate electrodes include third to fifth gate electrodes sequentially stacked in the vertical direction on the substrate, and
   wherein the first and second insulating interlayers are also on the cell region of the substrate, such that the first insulating interlayer covers the third gate electrode, and the second insulating interlayer is between the first insulating interlayer and the fourth gate electrode.

* * * * *